United States Patent
Federspiel et al.

(10) Patent No.: US 8,924,026 B2
(45) Date of Patent: Dec. 30, 2014

(54) ENERGY-OPTIMAL CONTROL DECISIONS FOR SYSTEMS

(75) Inventors: Clifford C. Federspiel, El Cerrito, CA (US); Jerry Chin, El Cerrito, CA (US)

(73) Assignee: Vigilent Corporation, Oakland, CA (US)

( * ) Notice: Subject to any disclaimer, the term of this patent is extended or adjusted under 35 U.S.C. 154(b) by 698 days.

(21) Appl. No.: 13/215,189

(22) Filed: Aug. 22, 2011

(65) Prior Publication Data

US 2012/0101648 A1    Apr. 26, 2012

Related U.S. Application Data

(60) Provisional application No. 61/375,778, filed on Aug. 20, 2010.

(51) Int. Cl.
| | |
|---|---|
| G05D 11/00 | (2006.01) |
| H05K 7/20 | (2006.01) |
| G05D 23/19 | (2006.01) |
| H05K 7/14 | (2006.01) |
| F24F 11/00 | (2006.01) |

(52) U.S. Cl.
CPC ........ *G05D 23/1934* (2013.01); *H05K 7/20836* (2013.01); *F24F 11/006* (2013.01); *H05K 7/1498* (2013.01)
USPC .......................................... 700/276; 700/291

(58) Field of Classification Search
None
See application file for complete search history.

(56) References Cited

U.S. PATENT DOCUMENTS

| | | |
|---|---|---|
| 4,873,649 A | 10/1989 | Grald et al. |
| 5,170,935 A | 12/1992 | Federspiel et al. |
| 5,464,369 A | 11/1995 | Federspiel |
| 5,550,752 A | 8/1996 | Federspiel |
| 5,768,121 A | 6/1998 | Federspiel |
| 5,862,982 A | 1/1999 | Federspiel |
| 5,875,109 A | 2/1999 | Federspiel |

(Continued)

FOREIGN PATENT DOCUMENTS

| | | |
|---|---|---|
| EP | 0501432 | 9/1994 |
| JP | 05-231693 A | 9/1993 |

(Continued)

OTHER PUBLICATIONS

International Search Report and Written Opinion in PCT/US2011/048677, mailed Mar. 27, 2012, 10 pages.

(Continued)

*Primary Examiner* — Ryan Jarrett
(74) *Attorney, Agent, or Firm* — Kilpatrick Townsend & Stockton LLP; David B. Raczkowski

(57) ABSTRACT

Methods, systems, and apparatuses are provided for controlling an environmental maintenance system that includes a plurality of sensors and a plurality of actuators. The operation levels of the actuators can be determined by optimizing a penalty function. As part of the penalty function, the sensor values can be compared to reference values. The optimized values of the operation levels can account for energy use of actuators at various operation levels and predicted differences of the sensor values relative to the reference values at various operation levels. The predicted difference can be determined using a transfer model. An accuracy of the transfer model can be determined by comparing predicted values to measured values. This accuracy can be used in determining new operational levels from an output of the transfer model (e.g., attenuating the output of the transfer model based on the accuracy).

29 Claims, 18 Drawing Sheets

(56) References Cited

U.S. PATENT DOCUMENTS

| | | | |
|---|---|---|---|
| 5,920,478 A | 7/1999 | Ekblad et al. | |
| 6,101,459 A | 8/2000 | Tavallaei et al. | |
| 6,402,043 B1 | 6/2002 | Cockerill | |
| 6,470,230 B1 | 10/2002 | Toprac et al. | |
| 6,557,574 B2 | 5/2003 | Federspiel | |
| 6,719,625 B2 | 4/2004 | Federspiel | |
| 6,865,449 B2 | 3/2005 | Dudley | |
| 7,058,477 B1 | 6/2006 | Rosen | |
| 7,089,087 B2 | 8/2006 | Dudley | |
| 7,097,111 B2 | 8/2006 | Riley et al. | |
| 7,117,129 B1 | 10/2006 | Bash et al. | |
| 7,363,094 B2 | 4/2008 | Kumar | |
| 7,664,573 B2 | 2/2010 | Ahmed | |
| 7,676,280 B1 | 3/2010 | Bash et al. | |
| 7,839,275 B2 | 11/2010 | Spalink et al. | |
| 7,847,681 B2 | 12/2010 | Singhal et al. | |
| 7,890,215 B2 * | 2/2011 | Duncan | 700/276 |
| 7,894,943 B2 * | 2/2011 | Sloup et al. | 700/276 |
| 8,126,574 B2 * | 2/2012 | Discenzo et al. | 700/28 |
| 8,224,489 B2 | 7/2012 | Federspiel | |
| 8,255,085 B2 * | 8/2012 | Salsbury | 700/276 |
| 8,374,731 B1 | 2/2013 | Sullivan | |
| 2002/0020446 A1 | 2/2002 | Federspiel | |
| 2003/0064676 A1 | 4/2003 | Federspiel | |
| 2003/0067745 A1 | 4/2003 | Patel et al. | |
| 2003/0200050 A1 | 10/2003 | Sharma | |
| 2004/0065097 A1 | 4/2004 | Bash et al. | |
| 2005/0096789 A1 | 5/2005 | Sharma et al. | |
| 2006/0116067 A1 | 6/2006 | Federspiel | |
| 2006/0206291 A1 | 9/2006 | Bash et al. | |
| 2006/0234621 A1 | 10/2006 | Desrochers et al. | |
| 2007/0089446 A1 | 4/2007 | Larson et al. | |
| 2009/0204267 A1 * | 8/2009 | Sustaeta et al. | 700/291 |
| 2009/0271150 A1 | 10/2009 | Stluka et al. | |
| 2011/0161059 A1 | 6/2011 | Jain et al. | |
| 2011/0203785 A1 | 8/2011 | Federspiel | |

FOREIGN PATENT DOCUMENTS

| | | |
|---|---|---|
| JP | 06-323595 A | 11/1994 |
| WO | 95/01592 A1 | 1/1995 |
| WO | 2006/099337 | 9/2006 |

OTHER PUBLICATIONS

International Search Report and Written Opinion mailed Sep. 25, 2009 in PCT/US2009/035905, 10 pages.

International Search Report and Written Opinion mailed Oct. 20, 2010 in PCT/US2010/046228, 13 pages.

Written Opinion mailed Feb. 14, 2013 in Singaporean Patent Application No. 201201144-1, 10 pages.

* cited by examiner

ENERGY-OPTIMAL CONTROL DECISIONS FOR SYSTEMS

CROSS-REFERENCES TO RELATED APPLICATIONS

The present application claims the benefit of U.S. Provisional Application No. 61/375,778, entitled "ENERGY-OPTIMAL CONTROL DECISIONS FOR HVAC SYSTEMS", filed Aug. 20, 2010, the entire contents of which are herein incorporated by reference for all purposes.

The present application is related to commonly owned filed non-provisional application "Method And Apparatus For Efficiently Coordinating Data Center Cooling Units" by Federspiel et al. U.S. Pat. No. 12/860,820 (hereinafter Federspiel II) and is also related to U.S. Non-Provisional application Ser. No. 12/396,944 by C. Federspiel, entitled "Method and Apparatus for Coordinating the Control of HVAC Units" filed Mar. 3, 2009 (hereinafter Federspiel I), the entire contents of which are herein incorporated by reference for all purposes.

BACKGROUND

The present invention generally relates to environmental control systems, such as heating, ventilation, and air conditioning (HVAC) systems, which can be used to control the temperature and humidity of common spaces, e.g., as can exist in data centers containing server computers. More, specifically the present invention can relate to efficiently operating the modules in an optimized manner (e.g. energy and/or monetary cost), while providing desirable environmental conditions.

Modern datacenters use HVAC systems to control indoor temperature, humidity, and other variables. It is common to have many HVAC units deployed throughout a data center. They are often floor-standing units, but may be wall-mounted, rack-mounted, or ceiling-mounted. The HVAC units also often provide cooled air either to a raised-floor plenum, to a network of air ducts, or to the open air of the data center. The data center itself, or a large section of a large data center, typically has an open-plan construction, i.e. no permanent partitions separating the air in one part of the data center from the air in another part. Thus, in many cases, these data centers have a common space that is temperature-controlled and humidity-controlled by multiple HVAC units.

HVAC units for data centers are typically operated with decentralized, stand-alone controls. It is common for each unit to operate in an attempt to control the temperature and humidity of the air entering the unit from the data center. For example, an HVAC unit may contain a sensor that determines the temperature and humidity of the air entering the unit. Based on the measurements of this sensor, the controls of that HVAC will alter operation of the unit in an attempt to change the temperature and humidity of the air entering the unit to align with the set points for that unit.

For reliability, most data centers are designed with an excess number of HVAC units. Since the open-plan construction allows free flow of air throughout the data center, the operation of one unit can be coupled to the operation of another unit. The excess units and the fact that they deliver air to substantially overlapping areas provides a redundancy, which ensures that if a single unit fails, the data center equipment (servers, routers, etc.) will still have adequate cooling.

As mentioned above, the standard operating procedure for the HVAC units is to control the return air temperature into each HVAC unit. Such operation is not aware of the temperature of the air entering the servers and other computing equipment in the data center. Since this information is not available to the HVAC unit controls or to the data center operators, the extra HVAC units are typically run at all times, to ensure that the servers are kept cool. However, such precautionary measures waste energy.

While it is possible to manually turn off redundant HVAC units to save energy, doing so poses a risk of overheating that equipment. Also, some data centers have variable loads, in which case it may be necessary to stop and start several units throughout the day. Furthermore, the complex and tightly coupled airflow patterns in a data center make it difficult for an operator to know which HVAC unit will be the most effective to restart should a need be identified.

Additionally, current methods ignore the cost (e.g., energy usage or maintenance) of HVAC units when determining how to control the units. Current methods can also be unstable if more complex algorithms are attempted.

Therefore, it is desirable to provide methods and systems that can account for costs of operating an HVAC system, and that are stable when accounting for redundant HVAC units.

BRIEF SUMMARY

Embodiments of the present invention can provide systems and methods for controlling environmental maintenance modules (e.g. HVAC units) using sensors. In various embodiments, a system can heat and/or cool an environment. The sensors can measure temperatures or other state variables (such as humidity, pressure, light) at various locations within the environment, and this temperature feedback can be used along with energy consumption information to change operation levels of the modules to keep the temperatures within or near a desired range while using minimal energy. These feedback control actions may be heuristic, such as slowing the speed of fans or changing the temperature of air produced by environmental maintenance modules to keep temperatures within or below settings specified by an operator. The feedback control actions may make use of traditional Proportional-Integral-Derivative (PID) feedback controllers to effect these control actions in such a way that many actuators receive the same control command.

In one aspect, predictive control decisions can made using a transfer model (e.g., a non-linear function or a linear function, such as a transfer matrix) to predict the impact of control actions (e.g., changes in operational levels of actuators) on state changes that can be incorporated into a penalty function. A computer system can compute the control action changes that will minimize the penalty function. In general, the control actions that minimize the penalty function involve changing all actuators at the same time. It is possible to restrict the number and type of actuators that get changed. For example, a status indicator may indicate that an actuator is overridden by a remote system, so it cannot be changed.

Heuristic feedback control actions can be combined with predictive control actions. This can be achieved by configuring the system as a multi-rate system, where feedback control actions are executed at a higher frequency, and predictive control actions are executed at a lower frequency. In one implementation, the model-based predictive control actions are used to modulate the common feedback control action sent to many actuators.

In another aspect, control action changes (from heuristic feedback or predictive, such as with a penalty function) that are actually executed can be attenuated based on the measured accuracy of past predictions. When the measured magnitude of recent past prediction errors is small, then a minimum attenuation is applied. As the measured magnitude of recent past prediction errors grows, the attenuation increases. If the measured magnitude of recent past prediction errors is sufficiently large, then the control actions are potentially not changed at all. In various implementations, the attenuation can be accomplished by adding or subtracting a value from a calculated change to an operational level as determined with the transfer model. In another embodiment, the attenuation can be from multiplying by a fraction or other value between 0 and 1 (including the end points).

Sometimes control actions are computed that reduce the penalty function, but don't necessarily minimize it. The decision to use a sub-optimal predictive control decision may be randomized, and/or may have a randomized level of sub-optimality. These sub-optimal predictive control actions are taken to ensure that the learning process has "persistently exciting" data, which can improve the accuracy of the transfer model predictions.

Predictive control actions can be executed slowly (e.g., once every 15 minutes). The actions must be made slowly enough that the system reaches quasi-steady state before the next predictive control decision is executed. The predictive control actions may also be executed asynchronously using a steady-state detector to determine when enough time has passed before the next predictive control action can be executed.

According to one embodiment, a method of controlling an environmental maintenance system is provided. The system includes a plurality of actuators and a plurality of sensors. Each sensor measures a value of a physical condition of an environment. Sensor values S corresponding to the sensors are received. A potential change dU to operation levels U of the actuators is determined. A computer system calculates a first contribution to a penalty function by applying a transfer model to dU to determine a predicted change dS in the sensor values S', determining new sensor values SNew from the predicted change dS, and using SNew to determine the first contribution to the penalty function. The transfer model provides a relation between changing an operation level of an actuator and resulting changes in sensor values. The first contribution is based on a relationship of each new sensor value relative to one or more respective setpoint values. The computer system also calculates a second contribution to the penalty function by determining new operation levels Unew corresponding to the potential change dU to the operation levels U, determining a cost of operating each actuator with the corresponding new operation level, and aggregating the costs to obtain the second contribution. A first value of the penalty function is determined based on the first and second contributions for the potential change dU. An optimal change to the operation levels U of the actuators is determined based on values of the penalty functions for a plurality of potential changes to the operation levels U. The operation levels of the actuators are set based on the optimal change.

According to another embodiment, sensor values S corresponding to the sensors are received. The sensor values S corresponds to operational levels U1 of the actuators. New operational levels U2 of the actuators are received, where U2−U1=dU. A change dS in the sensor values S is predicted. The change dS corresponds to the change dU, where the prediction is performed in accordance with a transfer model. The actuators are then operated with the new operational levels U2. New sensor values Snew are subsequently measured. The receiving, prediction, operation, and subsequent measurement are repeated a plurality of times. A metric of an accuracy of the transfer model is determined by comparing the predicted sensor values to the measured sensor values. A proposed change to the operation levels of the actuators is received, where the proposed change is based on the transfer model. The proposed change to the operation levels of the actuators is adjusted based on the accuracy metric. The operation levels of the actuators are set based on the adjustment to the proposed change.

Other embodiments of the invention are directed to systems, devices, and computer readable media associated with methods described herein.

As used herein, an environmental maintenance module may be an HVAC unit, a computer room air conditioner (CRAC) unit, or any device that receives control signals and provides an output that is designed to achieve or maintain an environmental condition in a specific area. A use herein, an operation level can be a value of an operational parameter (input or output) that measures how much effort is being expended by a module to perform an operation, such as heating of cooling. Operation levels of a module can include stopped, operating at full power, percentages of input power levels, percentages or values for operation of a particular device within the module (e.g. a fan speed, temperature setpoint, humidity setpoint, or valve position), and percentages or values of the output heating or cooling power of the output air stream, e.g., as compared to a reference level.

A better understanding of the nature and advantages of the present invention may be gained with reference to the following detailed description and the accompanying drawings.

DETAILED DESCRIPTION

Figure 1:
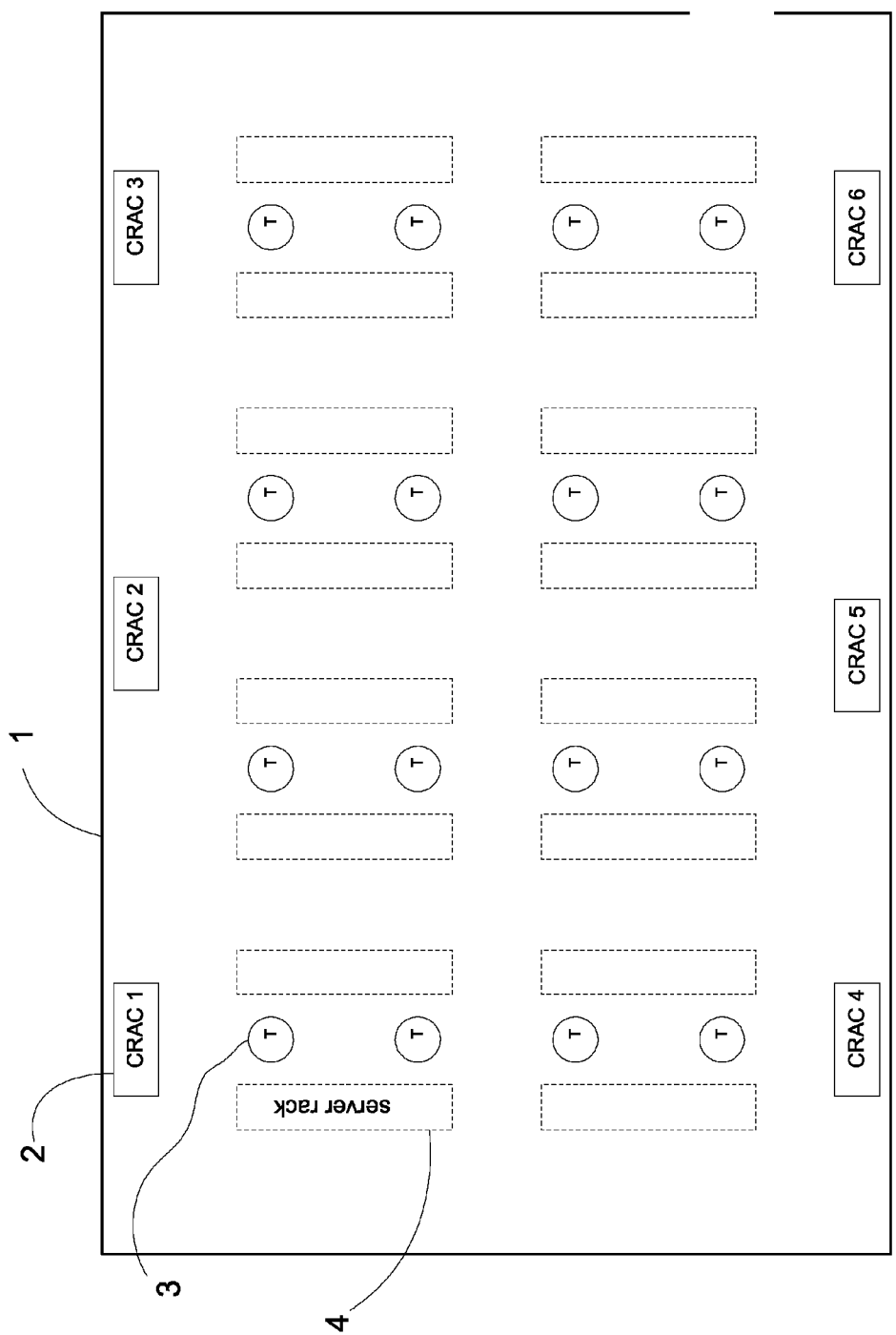
FIG. 1 is a plan view of a data center according to an embodiment of the present invention.

To ensure that an environment (e.g. a data center) is sufficiently cool or warm, standard operating procedure is to operate extra HVAC units (or other environmental maintenance modules) beyond what is marginally required. However, such precautionary measures waste energy. Various embodiments can analyze sensors throughout the environment (e.g., sensors across modules or at locations outside of modules) to determine whether the operation levels of specific modules can be safely reduced and whether increased operation is required (e.g. due to an out-of-range measurement), including which module is optimal for bringing the sensor back in range. Such embodiments can provide stable environments while reducing energy consumption. A transfer model (e.g., a matrix or set of matrices) can be used in performing the above determinations. In one aspect, the transfer model can provide a relation between a change in operation level of a module and resulting temperature differences for each sensor in the system. The transfer model can be used to optimize a penalty function (which includes a cost of operation) to determine optimal operational levels while keeping sensor values within range.

One problem with only using predictive control actions is that the predictive control decisions cannot be made quickly if the predictions are based on quasi-steady behavior. This means that if there is a disturbance between the control actions, the system may not react quickly enough, and control performance may be unacceptable. This problem can be corrected by combining heuristic feedback control actions with the model-based predictive control actions, e.g., using a multi-rate system, where the heuristic feedback control actions are executed at a higher frequency, and the model-based predictive control actions are executed at a lower frequency.

Another problem with only using predictive control actions is that the predictions may not always be accurate. As the operating point changes, the accuracy of the predictions may worsen. The accuracy can be improved by making the predictor adaptive, but there nevertheless may be a time period after a change in the operating point where the predictions will be less accurate. Control actions based on inaccurate predictions may lead to unacceptable control performance. This problem can be corrected by combining predictive control actions with heuristic feedback control actions that are known to have acceptable, albeit suboptimal, control performance. By using a measure of recent past prediction accuracy, the amount of emphasis on the predictive control decisions can be modulated so that when the prediction accuracy is low, the system relies mainly on the heuristic feedback control actions, but when the prediction accuracy is high, the system uses the model-based predictions to achieve optimal control performance. This solution has the further benefit of making the system fault-tolerant. If the model predictions fail completely, then the system can revert to solely using heuristic feedback control actions with acceptable, albeit suboptimal, control performance.

Another problem with running many redundant HVAC units, particularly when they deliver air to an underfloor plenum is that the discharge air temperature from the HVAC units can be higher than if fewer HVAC units were used. The discharge air temperature can be higher because, with more HVAC units being used, the temperature can be higher while still extracting the same amount of heat from the servers. In other words, a greater airflow (with the higher number of HVAC units) for extracting heat from the servers means that the discharge temperatures from the HVAC units can be higher. As a result, a concrete slab floor or a raised floor will not be as cool, which diminish disaster recovery capabilities. For example, having a cool floor increases the time available to recover from a cooling failure (e.g. when power is cut off for an entire building) because the slab and floor acts as cool storage media (heat sink). A colder temperature of a floor can keep the servers cooler when the HVAC units are not pushing out cool air, e.g., due to power being cut off.

I. System Overview

FIG. 1 shows a floor plan of a data center according to an embodiment of the present invention. Perimeter wall 1 may be the perimeter wall of a data center or the perimeter wall of a commercial building such as a retail store. A data center includes a plurality of HVAC units 2 (or other environmental maintenance modules), a plurality of environmental sensors 3, and a plurality of server racks 4. As shown, the HVAC units are computer room air conditioner (CRAC) units.

In one embodiment, HVAC units 2 are unitary equipment that provide airflow to the data center to cool servers in server racks 4. In one aspect, HVAC units 2 can cool, heat, humidify, or dehumidify air that passes through them. Environmental sensors 3 are devices that measure environmental parameters, such as temperature or humidity. Environmental sensors 3 can transmit measurements (also called readings) by any means, such as by wired or wireless communication means (e.g., Modbus, BACnet, Wi-Fi, WiMAX, ZigBee, or any other applicable protocol). The HVAC units 2 (and other modules mentioned herein) can be controlled by a computer system with one or more processors to provide specified conditions within the data center.

Figure 2:
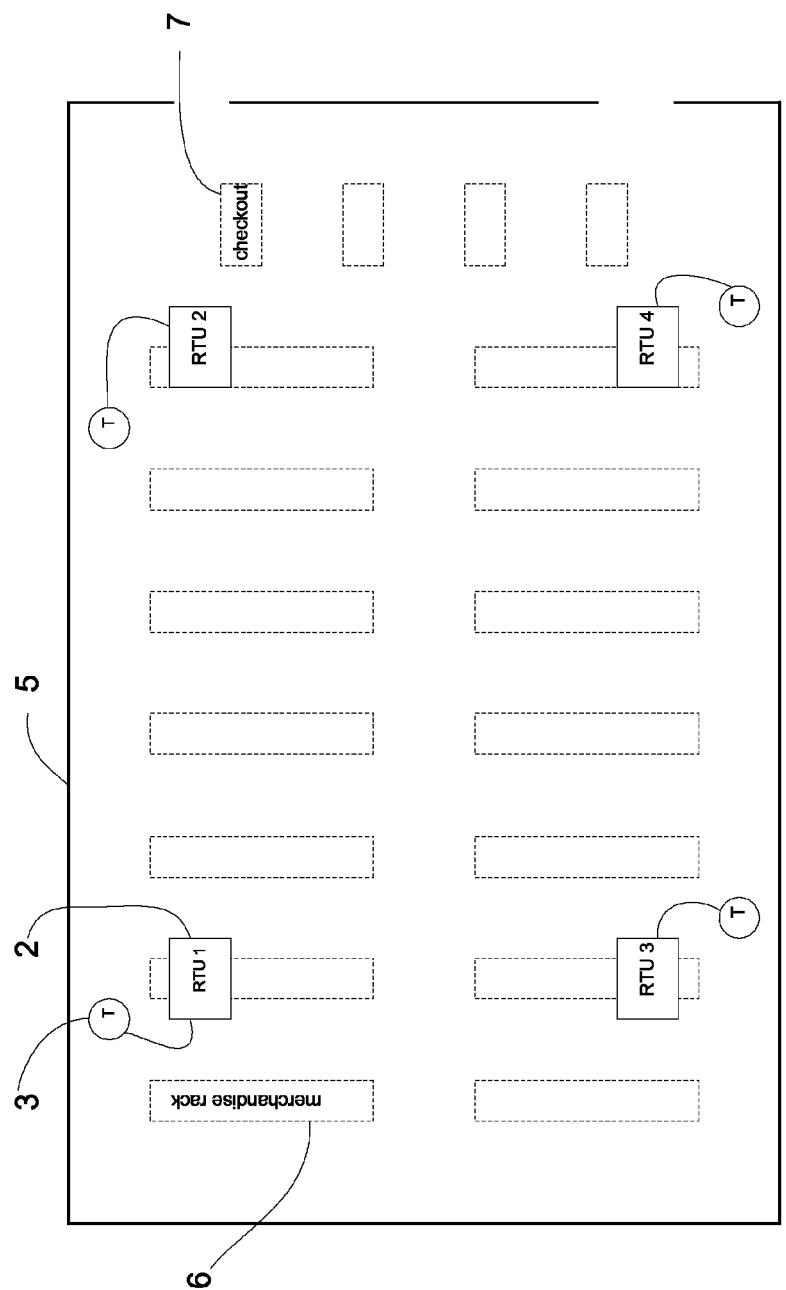
FIG. 2 is a plan view of an open-plan building conditioned by unitary rooftop units according to an embodiment of the present invention.

FIG. 2 is a plan view of an open-plan building conditioned by unitary rooftop units according to an embodiment of the present invention. In this example, the HVAC units are roof top units (RTU) 2. Perimeter wall 5 is an outside or inside wall of a commercial building such as a retail store or space within such a building or store. As depicted, a wired communication occurs between the RTU 2 and sensors 3 near that particular RTU, but wireless communications may also be used. Merchandise racks 6 and a store checkout counter 7 are also shown.

Figure 3:
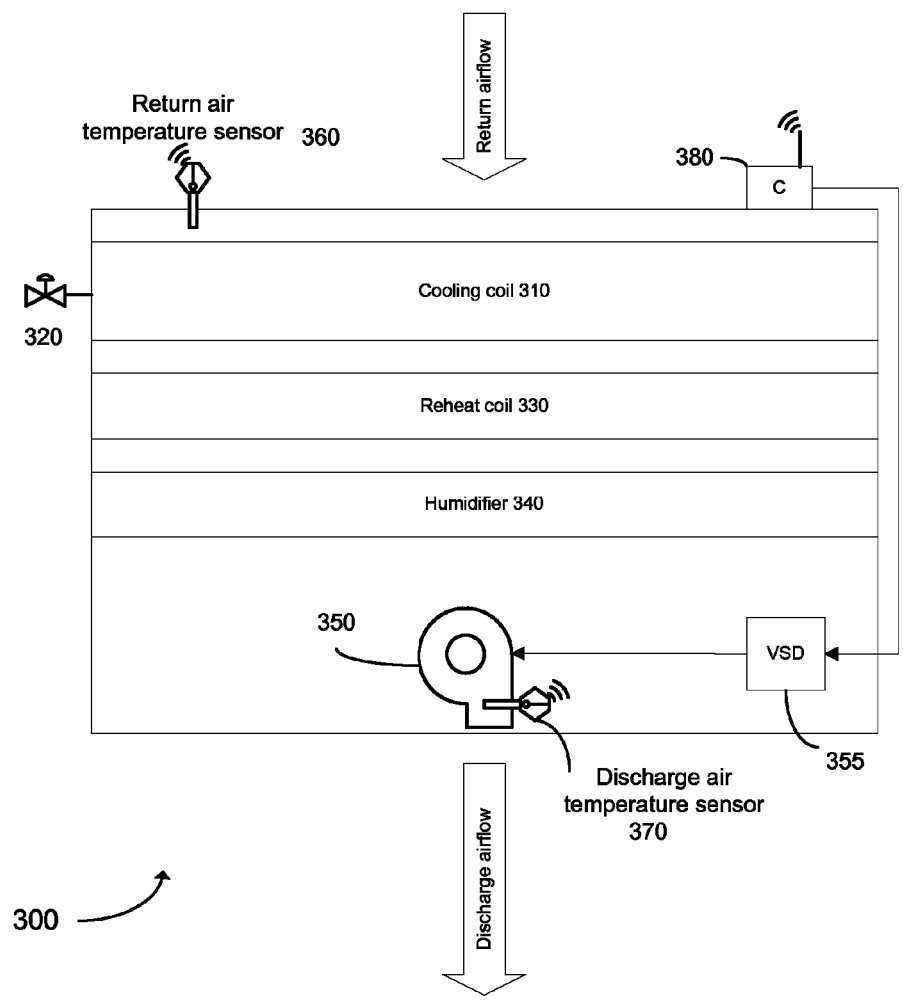
FIG. 3 is a schematic diagram of a computer room air handling unit 300 according to an embodiment of the present invention.

FIG. 3 is a schematic diagram of a computer room air handling unit 300 according to an embodiment of the present invention. Computer room air handling unit 300 is an example of an environmental maintenance module. As shown, computer room air handling unit 300 has a cooling coil 310, which may contain chilled water modulated by a chilled water valve 320. The computer room air handling unit 300 also has a reheat coil 330 (e.g. an electric coil) and a humidifier 340 (e.g. an infrared humidifier).

In one embodiment, fan 350 is a centrifugal fan driven by an A/C induction motor. The induction motor may have a variable speed (frequency) drive VSD 355 for changing its speed. A wireless sensor 360 measures return air temperature, a wireless sensor 370 measures discharge air temperature, and a wireless control 380 to control the VSD 355. The discharge air temperature sensor 370 and return air temperature sensors 360 may be probes tethered to the wireless control 380 rather than separate wireless sensors.

Figure 4:
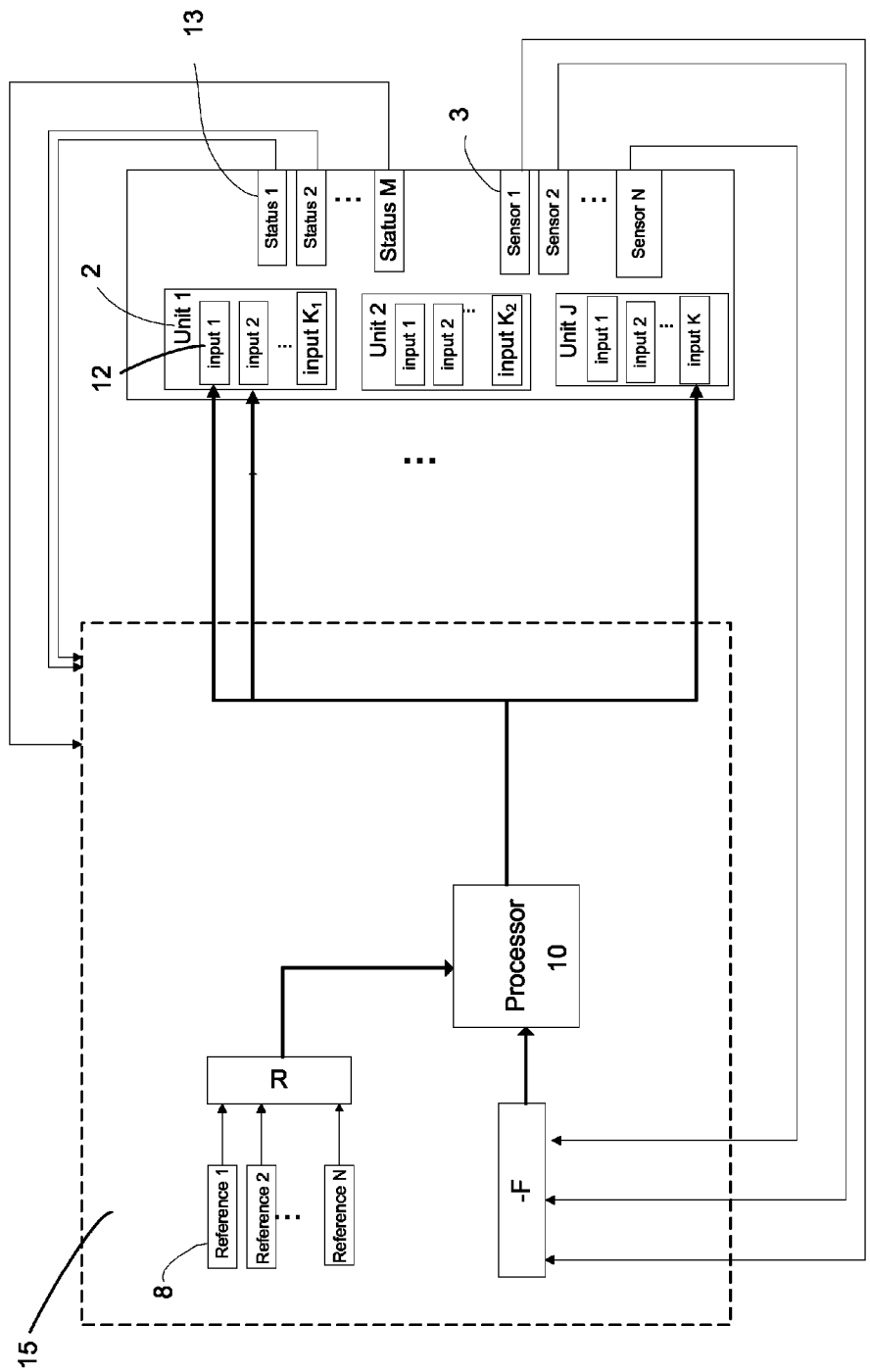
FIG. 4 is a block diagram of a control system 400 for providing maintenance of environmental conditions within a building according to an embodiment of the present invention.

In one embodiment of operation, the wireless sensors 360, 370 send readings over the radio to a wireless network gateway, which passes the signals to a control computer, e.g. which contains supervisory controller 15 of FIG. 4. Supervisory control 15 may be a computer system itself. The control computer can send actuation commands to the wireless gateway, which relays the commands to the wireless control 380, which changes the speed of the variable speed drive 355.

FIG. 4 is a block diagram of a control system 400 for providing maintenance of environmental conditions within a building according to an embodiment of the present invention. In this example, control system 400 comprises HVAC units 2 (such as unit 300), a plurality of environmental sensors 3, and a supervisory controller 15, which includes one or more processors 10 for performing calculations. The HVAC units 2 include final control elements (also called actuators), e.g., for fans, valves, or temperature elements, which may be used in maintaining the environment of a space. Inputs and outputs of the actuators may correspond to operation levels of a module, as mentioned herein. In one aspect, supervisory controller 15 can control the final control elements to have operation levels (including on and off, and variations in between) to provide stable environmental conditions using a reduced or minimal amount of energy.

Modules (HVAC Units)

In some embodiments, supervisory controller 15 can coordinate the operation of multiple HVAC units 2 by computing commands to inputs 12 of each HVAC unit 2. The commands are computed based on the environmental sensor readings from the sensors 3. The inputs 12 may correspond to a variety of different HVAC units 2 and/or devices or circuits within the HVAC units 2.

In one embodiment, input 1 of HVAC unit 1 may correspond to the operational parameter of one actuator (e.g. a fan, temperature setpoint, humidity setpoint, or valve position), and the input 2 of HVAC unit 1 may correspond to a different actuator of the same HVAC unit 1.

The operational parameter may have different operation values (levels), each resulting in a consumption of different amounts of energy. In another embodiment, some of the HVAC units 2 have only one input for control of an operation level.

In other embodiments, a setpoint for the temperature of an HVAC unit 2 can also be provided from supervisory controller 15. For example, a setpoint may be the desired temperature of the air discharged by the HVAC unit 2, or the desired temperature of the air returning to the unit. Other inputs could be the setpoint for the humidity (or the humidifier command), or a command to a variable frequency drive (VFD).

In one embodiment, each HVAC unit has the same number of inputs, each corresponding to one actuator of that HVAC unit. In another embodiment, different HVAC units may have a different number of actuators. In such an embodiment, the number of sensors may be the same regardless of the total number of actuators. In part, a reason the number of sensors may stay the same is because each sensor may affect each actuator, and vice versa. For example, a temperature actuator (e.g. cooling valve) can affect the humidity as may happen when condensate forms on the cooling coil if the environment is cold enough. Likewise, humidity actuators (e.g. infrared humidifiers and evaporative cooling valves) affect the temperature, as may happen when infrared humidifiers raise humidity or evaporative coolers raise humidity.

Sensors

Environmental sensors 3 can measure a value of a physical condition of an environment, such as temperature, humidity, and pressure. Environmental sensors 3 can send their readings back to supervisory controller 15, e.g., by wired or wireless communication means (such as Modbus, BACnet, Wi-Fi, WiMAX, ZigBee, or any other applicable protocol). Examples of sensors include temperature sensors, humidity sensors, and pressure sensors. A single sensor may be able to measure multiple environmental condition, e.g., all three of the above conditions. The environmental sensors 3 may be positioned randomly or according to a regular pattern. The environmental sensors 3 may also be organized via clusters of sensors or individually placed.

In some embodiments, supervisory controller 15 causes temperature sensor readings F to be within a temperature range R, e.g., as specified by an associated set of reference values 8. The range can simply be less than a certain temperature (e.g. less than 78 degrees Fahrenheit). The range can also be specified by two temperatures. Such a temperature range can be as small or as large as is desired. Such ranges can also be applied to heating. Certain embodiments can attempt to maintain a specified temperature range for each temperature (all of which may be different or be the same for each temperature sensor) while using a minimal amount of energy.

In one embodiment, supervisory controller 15 internally stores the set of desired reference values 8 for each environmental sensor, e.g. in flash memory, cache, or other suitable memory. In other embodiments, the reference values 8 may be stored externally, e.g. in a disk drive or optical drive. In operation, supervisory controller 15 adjusts operation levels of HVAC units 2 to keep the values from environmental sensors 3 with the specified range using a minimal amount of energy (e.g. by having the fewest possible modules running without exceeding the temperature range).

Inputs to HVACS

In one embodiment, supervisory controller 15 computes commands that are provided to inputs 12 and are used directly for final control elements (e.g. actuators) in HVAC units 2. These commands sent to the inputs 12 may be provided, e.g., by wired or wireless communication means. These commands may start, stop, or change any number of operation levels of the HVAC units 2.

In another embodiment, supervisory controller 15 computes commands to the inputs 12 that are used by a local digital controller (e.g. having microprocessor-based controls) in an HVAC unit 2. In one aspect, each input to the local digital controller of a unit corresponds to an actuator of the unit. The local digital controller can then determine the final commands sent to the final control elements. For example, the local digital controller may convert a digital signal to an analog signal for the actuator, or convert a protocol of the signal to be usable by an actuator. The local digital controller may also operate to maintain an actuator at a particular setting through a local control loop. Thus, supervisory controller 15 may command the setpoints of local control loops in the local digital controllers rather than directly commanding the final control elements.

Status Indicators

In one embodiment, supervisory controller 15 has means of receiving status indicators 13 from the environmental sensors 3 and/or the HVAC units 2. In one aspect, the status indicators 13 can provide information as to whether an HVAC unit 2 or a sensor 3 is presently operational. In another aspect, the status indicators 13 can provide settings of the HVAC units, such as return air temperature, discharge temperature, portion (e.g. percent) of the capacity of the unit that is being used (which is an example of an operation level), and how much a chilled water valve (e.g. 320) is open. The status indicators 13 are shown separated from the HVAC units 2 and sensors 3 for illustrative purposes, and may actually be received from the HVAC unit 2 or sensor 3 themselves.

In one embodiment, the status indicators 13 for the HVAC units 2 may be obtained from local digital controllers of the HVAC units 2. These local digital controllers can be queried by supervisory controller 15 to determine if the local digital controllers or the HVAC units 2 are "on" or "off". If a unit is "off", then the status indicator 13 for that unit's actuators could be a certain value, e.g., zero.

In another example, the environmental sensors 3 have some well-defined and easily detected failure modes. In one aspect, one failure mode is an "unreachable", which means that a gateway, e.g. a network interface of the supervisory controller 15, cannot communicate with the sensor. Another failure mode is an out-of-range voltage (either 0 volts or 1.5 volts), where 0 volts implies that the sensor probe has a short circuit and 1.5 volts indicates that the sensor probe has an open circuit or is missing. Any of these failures may result in a status indicator of zero for that sensor.

The transfer function model (TM), e.g., a matrix, is a measure of the effect of increasing (and potentially equivalently decreasing) an environmental maintenance module on an environmental sensor. The matrix can provide the effect for every sensor in the system, or just a portion of the sensors. In one aspect, the number of rows J of TM can equal the number of environmental sensors (also called cold aisle sensors or inlet air sensors for embodiments using having CRACs cooling server racks), and the number of columns can equal the number of environmental maintenance modules. Thus, in one embodiment, there is only one column for each module. In such an embodiment, there would be only one measure of the energy consumption of a module, i.e., one parameter for which an operation level is determined. In another embodiment, there may be more than one row for a module, and thus there can be more than one parameter, each providing a measurement of an operation level of the module. Note that the rows and columns may be switched. Also, the term "matrix" may be any indexable array of values.

II. Initializing Transfer Function and Load Matrices

The transfer function matrix (TM) is a measure of the effect of increasing (and potentially equivalently decreasing) an environmental maintenance module on an environmental sensor. The matrix can provide the effect for every sensor in the system, or just a portion of the sensors. In one aspect, the number of rows J of TM can equal the number of environmental sensors (also called cold aisle sensors for embodiments using CRAC units), and the number of columns can equal the number of environmental maintenance modules. Thus, in one embodiment, there is only one column for each module. In such an embodiment, there would be only one measure of the energy consumption of a module, i.e., one parameter for which an operation level is determined. In another embodiment, there may be more than one row for a module, and thus there can be more than one parameter, each providing a measurement of an operation level of the module. Note that the rows and columns may be switched. Also, the term "matrix" may be any indexable array of values.

As described herein, an operation level can be an input or an output value. For example, an input command (e.g. a voltage or digital value) of no power can be an operation level of 0, and an input of full power can be an operation level of 100% or some maximum value. The operation level can also be an input value for a particular actuator, e.g., a fan speed, temperature setpoint, humidity setpoint, or valve position, or an output measurement of the positions of such actuators. In another embodiment, the operation level can also be an output level, e.g., a level of cooling or heating provided. This output level can be a percentage of the actual level relative to a designed value, which can be exceed thereby providing a percentage of greater than 100%. When the parameter is an output value, there can be one or more input command variables used to change the output parameter.

Figure 5:
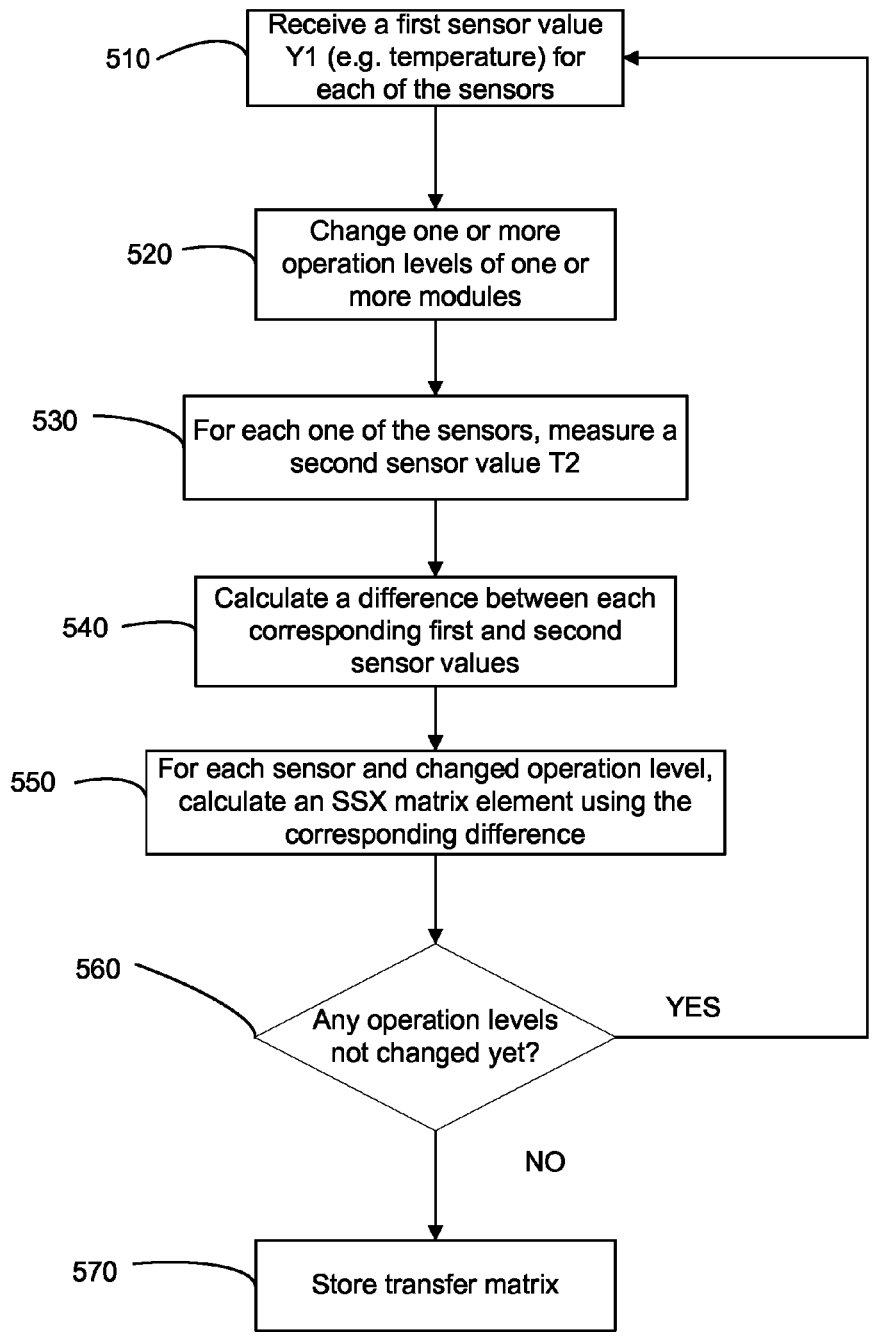
FIG. 5 is a flow diagram illustrating a method 500 of initializing an environmental maintenance system including a plurality of modules (e.g. CRAC units) and sensors according to an embodiment of the present invention.

FIG. 5 is a flow diagram illustrating a method 500 of initializing an environmental maintenance system including a plurality of modules (e.g. CRAC units) and sensors according to an embodiment of the present invention. In describing the method, reference will be made to FIG. 4. The initialization involves the creation of the transfer matrix TM. In one embodiment, the columns of TM are initialized by increasing and/or decreasing operation levels of the modules (e.g. starting and stopping), and taking a difference between temperatures before and after the change in an operation level. In one embodiment, the modules are decreased and increased sequentially (i.e. one at a time). In other embodiments, the columns of TM are initialized by changing the operation levels of multiple modules at a time.

In step 510, a first sensor value Y1 (e.g. temperature, humidity, or pressure) is received (e.g., at controller 15) for each of the sensors (e.g. from sensors 3). The first sensor value Y1 may be actively measured by a computer (e.g. controller 15) as a result of a measurement command, or passively obtained through a port able to receive transmitted messages. The first sensor temperature Y1 for a specific sensor J may be written as $Y1_J$. The first sensor values $Y1_J$ may be obtained once or may be obtained multiple times. For example, the first values Y1 may be obtained before the operation level of any module is changed, or may be obtained each time before the operational level of a particular module is changed.

In addition to the first sensor values Y1, other values may be recorded, such as an operation level of one or more operational parameters of a module. Examples of operational parameters input settings and measured output values, such as return temperatures (e.g. from sensors 360 in FIG. 3), discharge temperatures (e.g. from sensors 370), and flow rates (e.g., design flow rate times VFD percent command if the module has a VFD) may be measured and stored, e.g., in a memory communicably coupled with controller 15.

In step 520, one or more operation levels of one or more modules are changed. In one embodiment, all of the operation levels of a module are changed, which may be just one level. In another embodiment, only some of the operation levels of a module are changed. The operation levels not changed may be changed at another time, or may not be included in the calculation of the transfer matrix. In various embodiments, operation levels from multiple modules may be changed at the same time.

The amount of change in the operation levels may vary or may be equivalent in some manner. For example, each operational parameter that is changed can be changed by the same percentage (e.g. 100%, 50%, 25%, etc.). In one implementation, a 100% is measured against a designed maximum value for the parameter (e.g. 100% of the designed maximum air flow). It is possible to achieve an airflow greater than the designed air flow, and thus the percentage could be greater than 100%.

To determine the exact amount of change achieved for the operation level of a particular parameter, a measurement may be made of the parameter after a change command has been delivered. If the operational parameter is an output value, the new operation level may not be known directly from the change command. For instance, the change command may be to increase an airflow; and there may be some calibrated settings to know generally what airflow corresponds to the command, but the actual value for the airflow may be obtained more accurately by measurement. Also, some parameters may not be known at all except by measurement of an output value. In other embodiments, the change in operational level may be automatically known (e.g., if the change is to turn off, particularly if there is only on and off).

In step 530, a second sensor value Y2 is received for each one of the sensors. In one embodiment, a timer (e.g., with a web-configurable period) is started after the operation level of the module is changed. As a default, the period may be 15 minutes. In one embodiment, the second values Y2 are measured after the end of the timer. In another embodiment, the values are continually measured after the change command has been given, and the second sensor value Y2 is stored after the measured values come to a quasi-steady state condition. For example, the changing outputs of the sensors may have a certain rate of change after the perturbation. Once the rate of change decreases below a threshold, then a quasi-steady state condition may be determined. Absolute values for a threshold of changes in the outputs of the sensors is another example In step 540, a difference between each corresponding first sensor temperate Y2 and second sensor values Y2 is calculated (e.g. by processor 10). Thus, if there are N sensors being used, then there are N respective values of $Y2_J - Y1_J$ for each operational parameter that was changed, where J runs from 1 to N. This difference may be positive or negative. Typically for cooling, if the change is an increase in operation level, then the temperatures (the sensor values of interest for cooling) decrease and each $Y2_J - Y1_J$ is negative. Also typical for cooling, if the change is a decrease in operation level, then the temperatures increase and each $Y2_J - Y1_J$ is positive. However, these relations do not always hold true. For example, if the return temperature of a module is at or below a desired discharge temperature, the module may turn off its cooling capacity. Thus, the module would not provide cooling, but actually provide heating since the air would still be blown by a fan, which causes some heat to be imparted to the air. Thus, some transfer matrix elements can have opposite sign of others, which is counterintuitive.

In step 550, a TM matrix element is calculated, for each sensor, using the corresponding difference. For example, processor 10 may calculate the N×K matrix elements, where N is the number of sensors and K is the number of operational parameters changed. In one embodiment, if one operational parameter is changed at a time, then a single column can be updated at a time using a formula for each matrix element. In another embodiment, if more than one operational parameter is changed at a time, then multiple columns are updated at a time, with a combined formula (e.g. recursive least squares) being used to update the matrix elements.

In step 560, it is determined whether any more operational parameters have not been changed yet. If there are, then method 500 may repeat. In one embodiment, assume that the first iteration of method 500 decreased just one operational parameter $P_1$. In the next iteration, step 520 can include increasing the level of parameter $P_1$ to have an operation level of that before the last iteration, and step 520 can include decreasing a level of parameter $P_2$. Thus, one operation level is changed on the first iteration and two operational levels are changed on the second iteration. Other embodiments can have multiple operation levels decreasing and multiple increasing at every iteration. Such embodiments can use a recursive least squares method to determine the matrix elements, as is described below.

In one embodiment, this determination of whether any more operation levels need to be changed is equivalent to whether any more columns of TM need to be initialized. In an embodiment where there is one operation level for a module and the operation level options are on or off, then the determination is whether to start or stop a module. In such an embodiment, if there are more modules that need to be stopped, the stopped modules may then be re-started and other modules may then be stopped to determine other elements of the TM matrix. When a module is re-started, a start-stop timer can be restarted, and this initialization is performed for the next module after the start-stop timer expires.

In step 570, after all of the matrix elements of TM have been calculated, the transfer matrix TM can be stored in a memory of the environmental maintenance system. The transfer matrix can be retrieved for determining whether to change an operation level of an actuator. Such determination may be performed, for example, in methods 600-900. Certain embodiments for calculating matrix elements of a transfer matrix and a LOAD matrix are now described.

Calculation of a Matrix Element

In one embodiment with one operational parameter being changed at a time, the matrix elements of one column of TM that corresponds to the changed operational parameter are determined after the second sensor values are received. If the operational parameter is $U_{indx}$ (which has a one-one correspondence with a module in this embodiment) and the sensor index is $S_{indx}$, then a matrix element $TM(S_{indx}, U_{indx})$ can be computed as:

$$TM(S_{indx}, U_{indx}) = \frac{(Y2 - Y1)}{(\Delta \text{level})} \qquad \text{Eq. (1)}$$

where Y2 is the sensor value corresponding to $S_{indx}$ after the operational parameter $U_{indx}$ is changed, Y1 is the sensor value corresponding to $S_{indx}$ before the operational parameter $U_{indx}$ is changed, and $\Delta$level is a change in operation level of parameter $U_{indx}$. A normalization factor may also be used, e.g., if the change was not the same for each actuator. As described below, an energy factor can be included, which could be considered a normalization factor.

When the sensor values are a temperature and the modules function to cool, values of TM will typically be negative, e.g., because shutting off a module (or other decrease) should make Y2 greater than Y1, and the change in operation level ($\Delta$level) is negative. A similar result happens with starting a module (or other increase) as the temperature difference is negative, but $\Delta$level is positive. However, as mentioned above for step 540, the counter result can occur, which is counterintuitive.

TM can be normalized such that all of the matrix elements can correspond to a same units of Δlevel. For example, regardless of the actual change in level used to calculate a particular matrix element (e.g., 10%, 10 rpm), the matrix element can be multiplied by a factor so that every matrix element will have the same value in the denominator. Thus, in later steps a change in operation level can be used uniformly to determine a change in predicted temperature as opposed to the change in operation level being in different units for each matrix element.

In one embodiment, the Δlevel is a percentage of the change in the operation level, e.g., 100% for turning on to maximum capacity of the operation level, and −100% for turning off from the maximum operation level. In another embodiment, Δlevel is in units relative to minimum increments used to create the transfer matrix TM. For example, if the increment is 5V, 100 rpm, or other value (including percentage), then a change of 10V would be a value of 2 and 300 rpm would be a value of 3 if the transfer matrix TM was in units of the minimum increment. In another embodiment, if the transfer matrix was created in units based on a maximum level of operation across all modules (e.g. maximum power or fan setting), then Δlevel can be a fractional value. Each module can have a different range of operation level, e.g., one fan can have maximum speed of 2000 rpm and another 1000 rpm. In one aspect, Δlevel could provide normalization by itself. For instance, if the changes are always the same for a particular parameter then a normalization factor may not be needed.

In one embodiment, the operational parameter can be a percent capacity % Cap of heating/cooling flow that the module is operating. In this embodiment, Δlevel can correspond to % Cap when the change is shutting of the module. In one aspect, the value of % Cap can allow for a normalized measurement when all of the units are not operating at the same capacity. % Cap is an example of a current operation level.

In various embodiments, % Cap is either returned from a query of the unit, or it is calculated as follows:

$$\% \ Cap = \frac{F_P(TR_P - TD_P)}{F_D(TR_D - TD_D)}, \quad \text{Eq. (2)}$$

where $F_P$ is the flow rate of the stopped module before being stopped, $TR_P$ is the return temperature of the respective module P before being stopped, $TD_P$ is the discharge temperature of the respective module P before its operation level is changed, $F_D$ is the design flow rate of the unit, and $TR_D - TD_D$ is the design ΔT of the respective module P.

In one embodiment, the design ΔT may be the temperature difference when a cooling valve is all the way open or open to a preferable setting. Such value may depend on the temperature of the cooling substance (e.g. water) being used, which may be included as an additional factor. In another embodiment, modules with a fixed flow fan have the same values of $F_P$ and $F_D$. In such embodiment, the % Cap returned by a module may correspond to a setting of a cooling valve (e.g. valve 320).

In modules with a variable fan, $F_D$ may be 100% of capacity or some other percent or value for which preferable (e.g. optimal) operation of the unit occurs. In one aspect, the value of $F_P$ corresponds with a setting for the speed of the fan before the stopping. In other embodiments, the heat (or cooling) flow rate FΔT (design or before stopping) may be determined via other means, or simply just received from a module that measures this value.

Calculation of LOAD Matrix

In one embodiment, a LOAD matrix provides a measure of the effect of decreasing an operation level of a module on the capacity of the system. For example, the LOAD matrix can relate exactly how much the percent of capacity of a CRAC unit is increased to handle the heat load of servers of a computer room when one of the other CRAC units is turned off. In one embodiment, the number of rows and columns of LOAD equals the number of environmental maintenance modules.

The load matrix may be calculated at the same time as the transfer matrix TM. Thus, a column of TM could be calculated at a same time as a column of the LOAD matrix. In one embodiment, the load transfer function matrix (LOAD) is computed as follows:

$$\text{LOAD}(C_{indx}, K_{indx}) = \frac{\Delta\% \ Cap_{Cindx, Kindx}}{\% \ Cap_{Kindx}}, \quad \text{Eq. (3)}$$

wherein $\Delta\% \ Cap_{Cindx,Kindx}$ is the change in percent capacity of the module $C_{indx}$ induced by stopping (or otherwise decreasing) the module $K_{indx}$, and wherein $\% \ Cap_{Kindx}$ is the percent capacity of the module $K_{indx}$ prior to stopping. The value of $\text{LOAD}(C_{indx}, C_{indx})$ equals −100% by definition. In one embodiment, the value of $\text{LOAD}(C_{indx}, C_{indx})$ is not calculated or may also be set to 0 (or other default value) as this value is typically not used. The LOAD matrix may be stored in a memory of an environmental maintenance system, and then used later for determining which modules to have an operation level increased or decreased.

III. Using TM to Reduce Energy Use

The transfer matrix can be used to keep the sensors within acceptable ranges. The transfer matrix can also be used to determine operation levels that keep the sensors within acceptable ranges while using a reduced amount of energy. To determine the impact on energy, the change of operation levels is assumed to be a fixed value for each actuator (although not all the same). In this way, each of the actuators can be compared to each other, and identify which actuator affects a sensor the most. Thus, if this sensor is out of range, the actuator with the most impact can be taken as the actuator that is the most energy efficient, since the amount of energy imparted to the actuator is the most efficient.

In some embodiments, the amount of energy expended for an increase of each actuator is the same. For example, if each operational parameter of an actuator is the power level of a module and each module has the same energy efficiency, then there are no energy efficiency differences. Energy efficiency equivalence can also be assumed when differences are small.

In other embodiments, the actuators have different energy consumption. In such situations the change in sensor values (Y2−Y1) can be modulated by an energy factor. The modulated results can be compared so that energy consumption is accounted for in determining which actuators to change. For example, an actuator that uses less energy for a given change would have the modulated result increased relative to the difference in sensor values, thereby increasing the preference for having that actuator be changed. Whereas, an actuator that is less energy efficient would have the difference in sensor values reduced relatively. Such modulation for energy consumption can be included into the transfer matrix itself. The value of the modulation can be determined by changing each actuator by a same percentage and recording the energy usage. In various embodiments, the modulation can include multiplication, division, addition, and as an additional point in a coordinate system, which could involve addition, multiplication, and additional functional operations. Instead of a modulation, some embodiments can use an energy consumption value as an additional factor in determining which actuator to change. For example, the actuator that provides a suitable change in sensor values while having the smallest energy consumption can be chosen.

In one embodiment, a module's efficiency for heating/cooling flow is an example of an energy consumption factor. The efficiency may be taken as certain input settings of an actuator of a module (e.g. chilled water valve setting) or as the percent capacity from Eq. 2. In another embodiment, an efficiency η of a module $C_{indx}$ is computed as follows:

$$\eta(Cindx) = \frac{\%\ Cap}{FanSpd}, \quad \text{Eq. (5)}$$

where FanSpd is the percent of full fan speed that the module is currently using. In one embodiment, the fan speed is 100% for modules that do not have a variable fan. For modules with a variable fan, the fan may be operating at less that the maximum setting, and thus at below 100%.

In one aspect, using the fan speed in the denominator can place a preference on stopping modules that do not have variable fan speeds because fan speed will be 100% in that case, and the efficiency will be less. As shown, a less efficient module has a lower efficiency since the amount of cooling capacity is less for a given fan speed. Other efficiencies can include any percent output divided by a level of input, thereby measuring efficiency. For example a cooling output for a specific chilled water valve setting can be used to compute an efficiency for the actuator of the valve.

IV. Maintaining Sensor Values in Range

Figure 6:
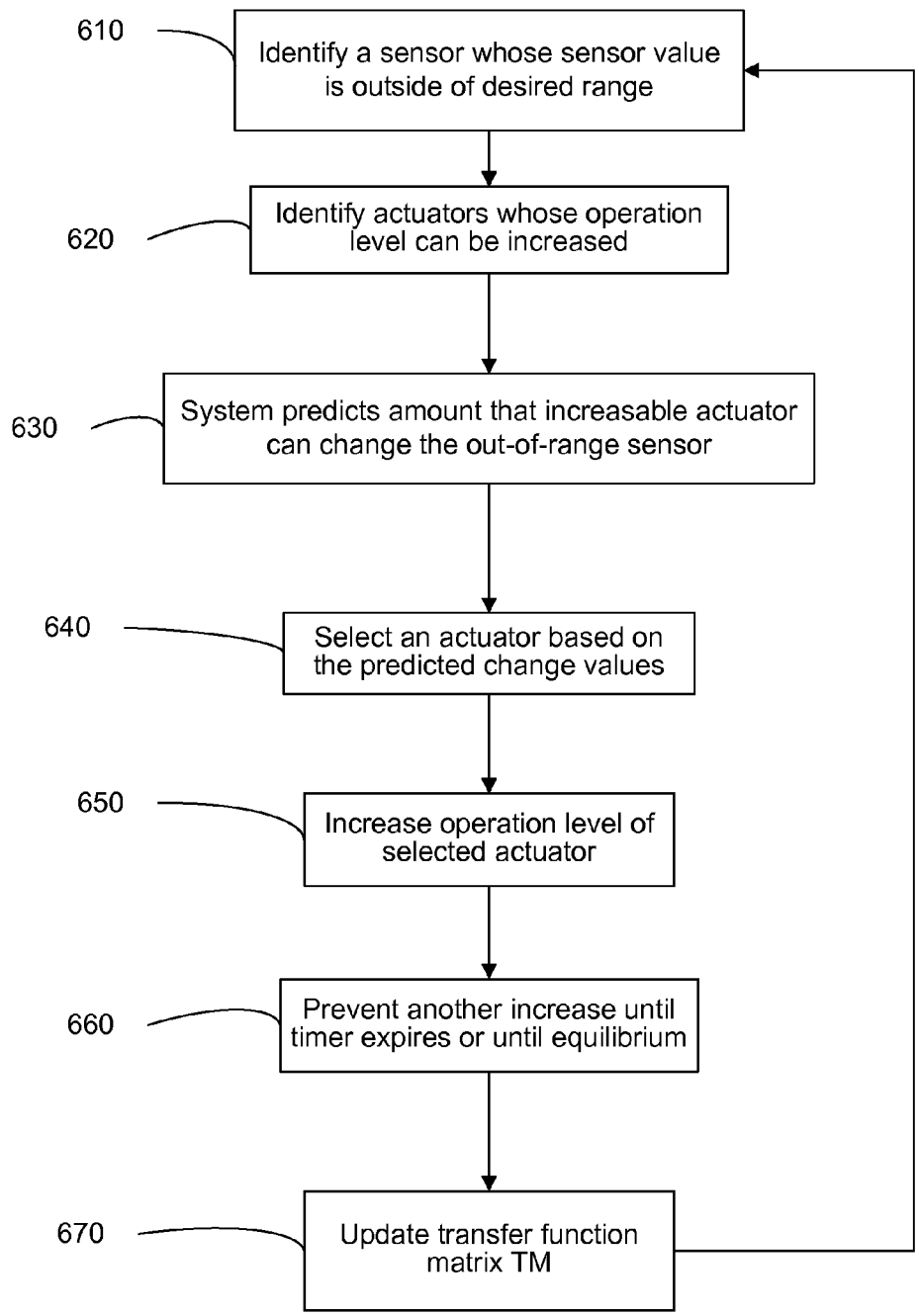
FIG. 6 is a flow diagram illustrating a method 600 of controlling an environmental maintenance system to maintain sensor values within a desired range with high efficiency according to an embodiment of the present invention.

FIG. 6 is a flow diagram illustrating a method 600 of controlling an environmental maintenance system to maintain sensor values within a desired range with high efficiency according to an embodiment of the present invention. Method 600 determines which one or more actuators are the best for changing (increasing or decreasing) operation levels when a particular sensor value has a sensor value outside of the desired range. For example, if the temperature of a sensor (e.g. a cold aisle sensor that is too hot) is beyond a threshold, method 600 can determine which modules should have an operation level increased (e.g., started) to bring the sensor back in range as quickly as possible or in an energy efficient manner. In one embodiment, the method 600 is performed in whole or in part by controller 15, or another computer or processor described herein.

In step 610, a sensor (e.g. one of sensors 3) whose sensor value is outside of the desired range is identified (e.g., a temperature is above a threshold value). In one embodiment, an application (e.g. software running on a processor of the system) can periodically check if there is a sensor value out of range. For systems that are cooling a room, such a sensor can be referred to as a hot spot since the sensor value is hotter than desired. For example, a sensor that is too hot may be identified by monitoring the sensors and having an alarm signal be sent when a sensor becomes out of range, e.g., higher than a threshold. The alarm signal may be generated internal to controller 15 or at another part of a control system.

In some embodiments, the desired range can be defined by a target value for a room. Examples of ranges include plus or minus a certain value from the target value, any value below the target value, or any value above the target value. The desired range may be web-configurable, with a default value (e.g. 83 degrees Fahrenheit for temperature of a data center).

In another embodiment, a sensor may be identified as being too cold, e.g., when the environment is required to be above a particular temperature. In such an embodiment, the modules would be providing heating and not cooling.

In step 620, one or more actuators whose operation level can be increased are identified as increasable actuators. The operation level can refer to any operational parameter for an actuator of a module. Examples of when an operation level may not be increased include when an actuator is at or a near a maximum operation level. In one embodiment, the criteria for this determination can be if the operation level is within a predetermined amount (e.g. a percentage) from a maximum level. In some instances, only some of the operational parameters of a specific module can be increased, while in others all of the operational parameters may be increased. In some embodiments the increase can be restricted to modules that are stopped, thus the increase would be a start command.

In some embodiments, decreasing an actuator may actually cause a sensor to move within range, or at least closer to within range. Such instances are described above for step 540 of method 500, e.g., when transfer matrix elements have an opposite sign. In such embodiments, step 620 can be modified to also include the identification of actuators whose decrease in operation level can provide a beneficial change in the identified sensor value. Below reference is made to increasing an operation level, but decreasing an operation level may also be performed.

In step 630, the system predicts amount (change value) that an increasable actuator (i.e. identified in step 620) would change the sensor value that is out of range. This prediction can be done for each increasable actuator. The predicted change value can be estimated by using a predetermined value (e.g. 50% or 100%) for an amount that the operation level of an actuator would be increased. In one embodiment, the predicted change value predicts an extent that starting the respective stopped module would change the temperature of the sensor is determined. Thus, in an embodiment, method 600 can estimate the impact on extinguishing a hot spot by starting each stopped CRAC unit.

In some embodiments, the predetermined increase in the operation level for each actuator is the same for purposes of determining the predicted change value. In other embodiments, the predetermined increase can differ among the increasable actuators. For example, the increase can be a certain percentage (e.g. 10%, 30%, or 100%) of the increase in the operation level. The actual amount of increase actually implemented can differ from the predetermined increase used to determine the predicted change values. In one embodiment, the predetermined increase is a full amount that the operation level of the actuator (which may be equivalent to the module) can be increased. For example, as different modules may be operating at different levels before the change, each module can have a different increase. Step 620 can account for the predetermined increase and/or actual increase to ensure that the identified actuators can actually have their operational levels increased by an appropriate amount.

In one embodiment, the predicted change value ΔY is obtained using the transfer matrix determined, e.g., as described above. One embodiment uses $$Y_{post} - Y_{pre} = TM(S_{indx}, U_{indx}) * \Delta \text{level}(U_{indx}) \quad \text{Eq. (6)},$$

where $Y_{post}$ is the estimated sensor value after a change, $Y_{pre}$ is the current sensor value that is out of range, $S_{indx}$ corresponds to the sensor that is out of range, and $U_{indx}$ corresponds to an actuator being considered for increasing an operational level. The predetermined increase is Δlevel, which may be different than the value used to create the transfer matrix TM. And, as mentioned above, Δlevel may be different than an actual amount that the actuator is increased.

Accordingly, in some embodiments, $Y_{post}$ can be the estimated hot spot temperature after starting CRAC $U_{indx}$, $Y_{pre}$ can be the hot spot temperature, $S_{indx}$ can correspond to the sensor having the hot spot temperature, and $U_{indx}$ can correspond to a CRAC being considered for starting. In one embodiment, $\Delta level(U_{indx})$ is the estimated change in capacity resulting from starting a module.

Referring back to FIG. 6, in step 640, an actuator is selected for increasing based on the predicted change values. In one embodiment, the value of $Y_{post}$ is considered the predicted change value. In another embodiment, the value of $Y_{post} - Y_{pre}$ is the predicted change value. Other predicted change values using TM may also be used. The change values can be used to ensure that the sensor value will be brought within range. In one aspect, $Y_{post}$ may be chosen to be lower/higher than the maximum/minimum value defining the range by a specified amount.

For example, $Y_{post}$ or $Y_{post} - Y_{pre}$ can be used to determine which actuators can change the sensor value to be within range. The change values can also determine which actuator has the biggest change in values for the sensor $S_{indx}$. In one embodiment, the module with the largest predicted change value is used because this module will presumably cure the out of range condition with the least amount of operational change, and thus the least amount of energy. In another embodiment, the module with the largest predicted change value can also be assumed change the sensor value the fastest, and naturally change the value the most so that another out of range condition is less likely for sensor $S_{indx}$. For example, the CRAC unit that provides lowest $Y_{post}$ may be used. The change value may be a positive or a negative value. Thus, the term largest may refer to the smaller number if the value is negative. In another embodiment, any one of the units that have a predicted change value that is greater than a change threshold may be used.

As mentioned above, the transfer matrix can include energy consumption factors for each of the actuators, e.g., as described above for Eq. 4. These energy consumption factors can also be used to modify the change values, e.g., if the factors are not in the transfer matrix already. For example, a module may be selected based on a minimization of fan power consumption or other power while still having $Y_{post}$ to be within range. In one embodiment, there is a preference for starting a module that has a variable fan speed, as these modules can operate below a maximum capacity.

In step 650, the operation level of the selected actuator is increased, or possibly decreased as mentioned above. As mentioned above, in one embodiment, the application shall increase the operation level of the actuator that has the biggest impact on extinguishing the hot spot (e.g. starting the CRAC unit that produces the lowest estimated temperature at the hot spot). More than one actuator or module can be increased if the estimated $Y_{post}$ with the actual change $\Delta level(U_{indx})$ is below a target value. In one embodiment, if none of the $Y_{post}$ values exceed a target value (or minus a deadband), then two actuators may be increased at the same time. The deadband can ensure that a sufficient change beyond an edge of the desired range is achieved.

As mentioned above, the operational parameter whose level is being increased can be an output parameter, e.g., the percent capacity mentioned above. A problem of using an output level can be that one may not be able to predict exactly what the output level is for a given input, particularly given that the output level may depend on the operation of other modules and actuators. Accordingly, it can be difficult to predict the exact change in operation level that will be achieved. In some embodiments, the change in operation level is estimated from the existing operation levels.

Some embodiments can estimate how that cold air is redistributed after the increase. A uniform redistribution can result in the default value of the average output levels of the operating modules times N/(N+1) where N is the number of operating units before increasing the new module for the actual output level. The average may be obtained from each module, or be assumed to be the same for all modules, and thus only one output level may be determined. In another embodiment, the output level may be determined from the LOAD matrix described above (equation 3), or a similar LOAD matrix that is created by increasing a module and measuring the changed capacity. The actual capacity may be differ from the actual capacity, but this estimated value can help determine if more than one module needs to be increased.

In step 660, other actuators are prevented from being increased, e.g., for a certain period of time or based on one or more criteria (e.g. a quasi-steady state condition as described above for method 500). In one embodiment, a timer is started after the selected one or more actuators are increased. In one aspect, the timer is a web-configurable timer (default 15 minutes) that shall prevent another increase until the timer expires. In another embodiment, a module can be prevented from increasing until the sensors values have reached an equilibrium in response to increasing an actuator. In one aspect, this prevents too many actuators from increasing at similar times, and thus using more units than are required, which might use too much energy.

In step 670, the transfer function matrix TM is updated. For example, the values of TM for the increased actuator (e.g. a started module) may be updated using equation 1. In this manner, one can determine how accurate the initialization was or adapt to changes in the load whose temperature is being maintained, and TM can be refined in response. Accordingly, this updating can handle a changing relationship in the transfer matrix. In this way, the system would change along with changing variables of the system, and thus may continue to provide accurate estimations.

In some embodiments, the first step of the update can be to record sensor values before any operation level is increased, as well as the operation level (e.g. percent capacity) of the selected actuators (which can include identifying the actuator to be off). A next step of the update can be to record the sensor values after a set time period or after the criteria is met, as well as the operation level of the actuators that have been increased. In one embodiment, the new matrix elements of TM in Equation 1 is calculated for the column(s) j corresponding to the actuators that are changed. The new TM is then updated as follows:

$$TM(i,j)_{new} = g*TM(i,j)_{new} + (1-g)*TM(i,j)_{old} \qquad \text{Eq. 7,}$$

where g is between 0 and 1 (e.g. a default 0.3). In one embodiment, the value of g could vary with time or depend on another variable. In other embodiments, other older TM matrices (i.e. matrix elements from previous updates, such $TM_{older}$) may be used to mix to obtain the $TM_{new}$.

In one embodiment, the operation levels of each of the actuators are measured and each of the columns are updated. Thus each of the rows would have the same change in sensor values, but the change in operation levels would vary. These other matrix elements can be computed when the operation level is an output level, which may change even though the input to only one actuator is changed.

In other embodiments, an aisle sensor (or other sensor) that is too cold may also be used to identify a cold spot. The above method may be used to turn on an HVAC unit that provides heating, e.g., when the system is attempting to heat an environment relative to an ambient temperature instead of cooling it as described above. In embodiments where the system is to be cooled, the sensing of a cold spot may trigger a stopping of one of the HVAC units. Such preventing of cold spots can help as low temperatures have been shown to be associated with premature disk drive failures. The stopping of a module may occur for other reasons as well.

Method 600 may repeat. For example, a check may be performed periodically to determine if any sensor is out of range. In one embodiment, the amount of increase can be at least a predetermined amount (which may be less than 100%). If the increase is less than full, on the next round, the same one or more actuators can be chosen.

In some embodiments, a preference may be made for starting or stopping an actuator (potentially a whole module) as opposed to just increasing or decreasing by an intermediate value. In one embodiment, if turning on an actuator does not bring the sensor value back in range then other actuators that are currently running may be analyzed. In another embodiment, the preference is only performed when there is a mix that can only be turned on or off, while the other actuators have other intermediate settings. These embodiments can be applied to other mentioned described herein. Two different transfer matrices can be used: one for determining whether to start or stop; and the other for determining whether to do a variable increase or decrease, which may be less than 100%.

Selecting Parameter to Change Using Randomness

If the operational parameter (e.g. power to a module) that provides the largest change value is always chosen, then certain parameters will always be changed. For example, changing the same actuator often may cause that transfer matrix to incorrectly weight that actuator, and thus cause a selection of that same actuator more in the future. To remove the bias, some embodiments select another actuator at random. The selection may still be restricted to actuators that still bring the sensor value within range. The randomness can prevent any particular patterns in the increasing of actuators, which would reflect biases and not a natural function of the system.

In one embodiment, the selection randomly chooses a second sub-optimal actuator. The total percentage that the sub-optimal actuator is chosen can be selected (e.g. 20% of the time), but the exact times for the sub-optimal selection may be random. In another embodiment, each actuator that is predicted to bring the sensor value back in range is allowed to be picked during a random selection.

Energy Savings Vs. Reliability

As mentioned above, sometimes decreasing an actuator can bring about a desired change in an out of range sensor value. Sometimes the change may not be sufficient to cause the sensor value to be back in range, but the change is still in the desired direction. For example, in cooling a data center, stopping a module can actually cause a temperature of a sensor to decrease.

In some embodiments, it is more desirable to save energy, than to have the sensor values back in range as quickly as possible. Thus, there can be a preference for decreasing an actuator than for increasing an actuator. In one embodiment, such a preference can be made among all actuator changes that can bring the sensor back in range. In another embodiment, such a preference can be made for a decrease even if the change does not bring the sensor back in range, as long as the change is toward the desired range. For example, if the range is less than 83° and the hot spot temperature is 87°, then a predicted change of an actuator to change the temperature to 85° would be acceptable for choosing to decrease the actuator. In one embodiment, the decrease is always stopping the actuator.

V. Saving Energy by Decreasing an Operation Level

When all of the sensors are within range, operation of the actuators can be decreased to save energy. Such decreased operation can be controlled to prevent an out-of-range condition for the sensor values. For example, as predicted change values were used above to determine which actuators will bring sensor values back into range, predicted change values can be used to determine which actuators will not cause an out of range condition.

Figure 7:
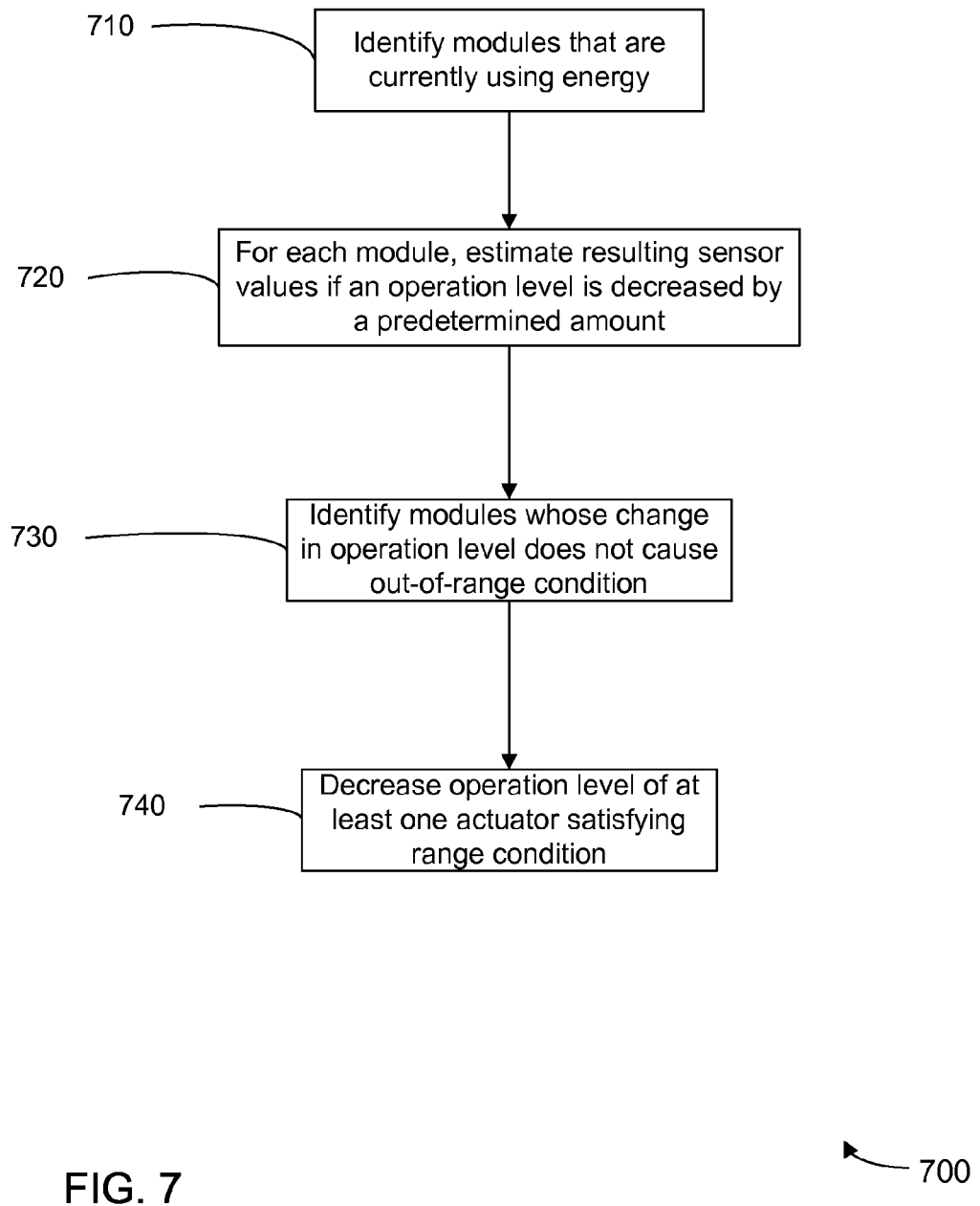
FIG. 7 is a flow diagram illustrating a method 700 of controlling an environmental maintenance system by decreasing operation of actuators according to an embodiment of the present invention.

FIG. 7 is a flow diagram illustrating a method 700 of controlling an environmental maintenance system by decreasing operation of actuators according to an embodiment of the present invention. Method 700 determines which actuators are acceptable to decrease. In one embodiment, the method 700 and other methods mentioned herein are performed wholly or partially by controller 15, or another processor described herein.

In step 710, actuators that are currently using energy (i.e. running) are identified. In various embodiments, the energy use may be electrical (e.g. power to a fan), thermal such as providing heating/cooling (e.g. supplying cold water to a cooling element), or combustible (e.g. burning gas to provide heat). In one embodiment, the identified actuators are also limited to the actuators that are available for decreasing. For example, if the power to a module is only operational parameter to be decreased, the module is viewed as a single actuator.

In step 720, the system estimates the resulting sensor values if an operation level of a running module were decreased by at least a predetermined amount (e.g. 50% or 100%). Resulting sensor values can be determined for each running module. The operation level corresponds to an actuator of a module, which can be considered the module itself. As there can be more than one actuator for a module, resulting sensor values can be determined for a predetermined amount of change for each actuator. In one embodiment, the following equation is used to determine the change in sensor value for a predetermined change Δlevel for parameter $$U_{indx}: Y_{post} = Y_{pre} + (S_{indx}, U_{indx}) * \Delta \text{level}(U_{indx}) \qquad \text{Eq. 8.}$$

In step 730, a first set of one or more of the plurality of the modules currently running that have none of the estimated sensor values outside of a first range is determined. For example, in one embodiment, if turning off a module will not cause an out-of-range condition, then that module would be part of the first set. In another embodiment, if decreasing one or more actuators of a module would not cause an out-of-range condition, then that module would be part of the first set. As described herein, each sensor can have a different range, and the term first range encompasses these different ranges. The range can include thresholds and a deadband value as described herein.

In step 740, an operation level of at least one module of the first set is decreased in response to the determination that one or more of the plurality of the modules currently running have none of the estimated sensor values outside of the first range. In one embodiment, the operation level may be an operation level for the whole module, e.g., turning off the module. In another embodiment, more than one operation level of an actuator may be decreased for a module. In yet another embodiment, various actuators for multiple modules may be decreased. In an embodiment, the combined effect of decreasing multiple actuators may be achieved by assuming linearity and simply summing the changes resulting from the decreases.

In some embodiments, the first set of modules that might have an operation level decreased is also restricted to modules that that have an efficiency (e.g. as computed from Eq. 5) less than a threshold (e.g. 40%). In one embodiment, the actuator with the lowest efficiency is decreased. In another embodiment, an operation level is not decreased if the load on the system after the decrease would be above a threshold. In one implementation, the load can be calculated using the LOAD matrix of Eq. 3.

The estimated percent capacity % $\overline{C}$ap of module $C_{indx}$, of each running module can be calculated as $$\% \overline{C}\mathrm{ap}(C_{indx}) = \% \mathrm{Cap}(C_{indx}) + \mathrm{LOAD}(C_{indx}, K_{indx}) * \% \mathrm{Cap}(K_{indx}) \qquad \text{Eq. 9,}$$

wherein the load matrix provides a measure of the effect of decreasing an operation level on the capacity of use of the other actuators. The load matrix element LOAD ($C_{indx}$, $K_{indx}$) provides a measure of the effect of stopping module $K_{indx}$ on the capacity of module $C_{indx}$. The estimated percent capacities can be summed or otherwise combined to determine a total load. % Cap(Sindx) is the CRAC unit that is going to be stopped and % Cap(Cindx) is for the CRAC unit whose efficiency is being determined. The overbar for % $\overline{C}$ap(Cindx) denotes that the value is an estimate.

In one embodiment, decreasing the operation level of another module is prevented until a predetermined amount of time expires after decreasing the at least one module of the first set.

In another embodiment, the transfer matrix elements can be updated in a similar manner as described above. For example, sensor values before and after the decrease can be used as well as the change in operation level of one or more actuators.

VI. Stopping a Module

Figure 8:
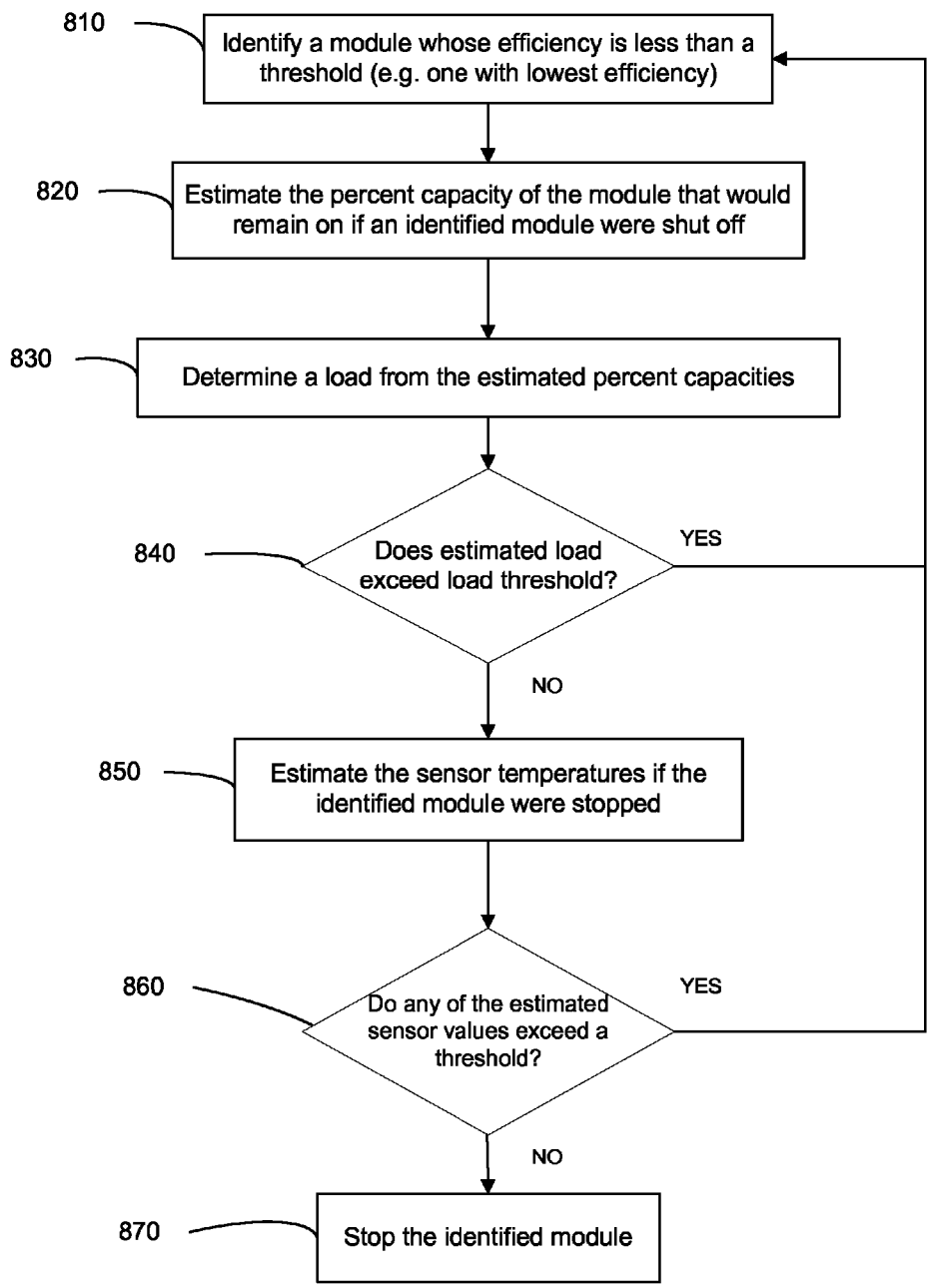
FIG. 8 is a flow diagram illustrating a method 800 of controlling an environmental maintenance system including a plurality of modules and sensors by stopping modules according to an embodiment of the present invention.

As mentioned above, the process of identifying a module to decrease an operation level of an operational parameter can result in stopping the module completely. FIG. 8 is a flow diagram illustrating a method 800 of controlling an environmental maintenance system by stopping modules including a plurality of modules and sensors according to an embodiment of the present invention. Method 800 can determine which module is the best one to stop. Specifically, method 800 describes an example where the system can provide cooling and the sensors are temperature sensors.

In step 810, a module whose efficiency is less than a threshold is identified. In one embodiment, the threshold is web-configurable (e.g. default is 40%). The efficiency can be measured using Eq. 5 or using other methods described herein. In one embodiment, method 800 can first find the module with the smallest value of efficiency on the first iteration. In this manner, the unit that is doing the least amount of cooling (or heating depending on the embodiment) will be targeted for possibly shutting off. In other embodiments, more than one module may be identified per iteration.

In step 820, the percent capacity of each module that would remain on if the identified module were shut off is estimated. In one embodiment, the application shall estimate the percent capacity of each CRAC unit that would remain on if the target unit were shut off using Eq. 9.

In step 830, an energy load is determined from the percent capacities. In one embodiment, the energy load is expressed as an average percent capacity of the system. In another embodiment, the heat load is the total energy load of the system, e.g., as determined by summing terms of the percent capacities multiplied by the respective capacity of a unit. In another embodiment, the energy load corresponds to the largest percent capacity of a module.

In step 840, it is determined whether the estimated energy load exceeds a load threshold. If the estimated energy load does not exceed the load threshold, then the method proceeds. If the estimated energy load does exceed the load threshold, then the method returns to step 810 to identify another module for possibly stopping. This determination helps to prevent the system form being overloaded by the stopping of a module.

In one example, if shutting off the target module would not cause the energy load to exceed a target percent of the capacity that would remain on after a unit is shut off (default=90%), then that module is shut off. In one embodiment, if shutting off the least efficient module would overload the modules that remain on or cause an out-of-range condition (e.g. a hot spot), then the next lowest efficient module shall be evaluated for stopping.

In an embodiment where the energy load is the largest percent capacity of a module, the efficiency threshold may be larger than that used for the total capacity (e.g. 95%). Both types of thresholds may also be used.

In step 850, the sensor temperatures if the identified module were stopped are estimated. In one embodiment, the application estimates the cold aisle temperatures if the target CRAC unit were shut off using Eq. 8.

In step 860, it is determined whether any of the estimated sensor values exceed a threshold, i.e. are outside of a range. This step helps to prevent creating a hotspot. If the estimated sensor values do not exceed the threshold, then the method proceeds. If the estimated sensor values do exceed the threshold, then the method returns to step 810 to identify another module.

In one example, if shutting off the target module would not cause any sensor values to exceed the threshold minus a deadband (e.g. 83 degrees F. minus 2 degrees F.), then the target module can be stopped. The use of the deadband can ensure that the sensor will not get close to the threshold.

In one embodiment, the target temperature (or other sensor value) used to determine a hot spot is the same target temperature used to determine whether a sensor temperature exceeds a target threshold minus a deadband.

In step 870, the identified module is stopped. In one embodiment, after stopping the identified module, a start-stop timer, e.g., with a web-configurable limit (default 15 minutes) shall be started, and another CRAC unit shall not be stopped until the start-stop timer expires.

Also, the values of TM corresponding to the target CRAC unit may be updated as described above after the start-stop timer expires. In one aspect, the first step of the update is to record the cold aisle temperatures and percent capacities of the CRAC units that are on, including the one being stopped, before the start-stop timer is restarted. The second step of the update is to record the cold aisle temperatures and percent capacities after the start-stop timer expires. The values of TM in Equations 1 and 2 are then computed and updated, e.g., according to Equation 5.

VII. Starting and Stopping

In some embodiments, a control system can keep track of which actuators should be changed (increase or decrease) to efficiently maintain sensor values within the desired range, and at different times track which actuators can be decreased to save energy without causing an out of range condition. In one embodiment, the logic for maintaining sensor values within range trumps the logic for decreasing energy use. For example, if there is a CRAC with a low efficiency and a there is a hot spot at the same time, then a CRAC will be started, not stopped.

Figure 9:
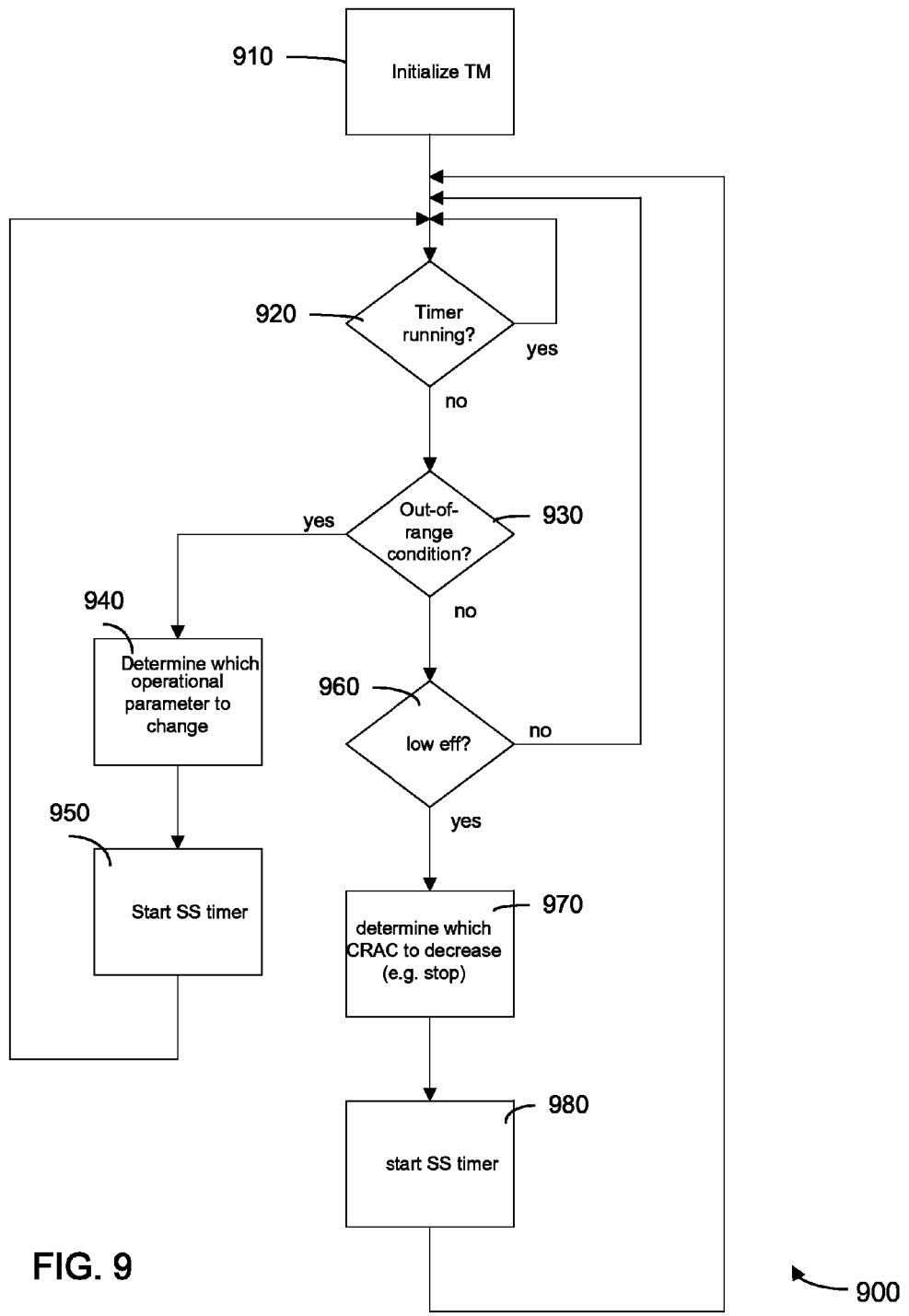
FIG. 9 is a flow diagram illustrating a method 900 of controlling an environmental maintenance system by starting and stopping modules including a plurality of modules and sensors according to an embodiment of the present invention.

FIG. 9 is a flow diagram illustrating a method 900 of controlling an environmental maintenance system by increasing or decreasing operation levels of modules to maintain sensor values within a desired range and reduce energy use according to an embodiment of the present invention. Method 900 can determine which actuator is best to increase or decrease based on different conditions.

In step 910, the transfer matrix TM (see Eq. 1) and potentially the LOAD matrix (Eq. 3) are initialized. In one embodiment, the transfer matrix TM is initialized using method 500. In other embodiments, the transfer matrix TM may be received by a control system when default values are assumed or when initialization is performed by another control system.

In step 920, it is determined whether a change in an operation level of an actuator is prevented. As mentioned herein for various embodiments, the prevention may be determined by a timer or by criteria, e.g., whether a quasi-steady state condition has been achieved in the sensor values. As an example, if the timer has not expired, then the process takes the "yes" branch and waits until is acceptable to start or stop a module, or otherwise change an operation level of an actuator of a module. If the timer has expired then the process continues along the "no" branch. The determination of prevention of a change can be made periodically at a relatively high frequency, such as every 10 or 30 seconds.

In step 930, the sensor values are monitored to determine whether an out-of-range condition is present. In one embodiment, temperatures (e.g. the cold aisle temperatures near the servers) are monitored to determine whether a hot spot (or other violation of a threshold) is occurring. If an out-of-range condition is present, the process moves to step 940. If an out-of-range condition is not present, the process moves to step 960.

In one embodiment, the sensor values can be monitored even though a change in operation level is prevented. In this manner, once the prevention is lifted, the process can move forward with handling an out-of-range condition that has occurred when the prevention was in place.

In step 940, a control system can determine which operational parameter(s) to change to bring the sensor values back into range. Such a determination can be made by any of the embodiments of method 600. In one embodiment, the operational parameter is whether to start or stop a module. In another embodiment, the operational parameter may be an operation level of one or more actuators.

In step 950, a timer is started to prevent other operation levels from being changed until the timer expires and/or until a quasi-steady state condition is achieved, as may also be done for other steps of other methods mentioned herein. The TM and/or LOAD matrices may be updated when the timer expires.

Returning to the branch if no out-of-range condition is present, in step 960, it is determined whether any of the actuators (potentially including a whole module) have an efficiency that is below an efficiency threshold. The efficiency may be determined by any of the methods mentioned herein. In one embodiment, if no module is operating below the energy threshold, then the process returns to step 920. In another embodiment, the process may continue even if no module is operating with an efficiency below the threshold.

In step 970, it is determined whether an actuator can have its operation level decreased (e.g. stopped) without causing an out-of-range condition. The prediction of whether an out-of-range condition will occur can be performed as mentioned herein. For example, such determination may be made by any of the embodiments of method 700. In one embodiment, the module with the highest capacity that still does not cause an out-of-range condition is decreased (e.g. stopped).

In step 980, a timer is started to prevent other units from being changed until the timer expires and/or until a quasi-steady state condition is achieved. The TM and/or LOAD matrices may be updated when the timer expires.

VIII. Covariance Matrix

In addition to the transfer matrix, an embodiment can use a covariance matrix. In one embodiment, the covariance matrix is a square matrix the size of the number of control actions (i.e., it has the same number of rows and columns as the number of elements of u). The initial covariance matrix can be an identity matrix multiplied by a large number (e.g., 1e6). In one aspect, the covariance matrix can describe the uncertainty in the estimated values of the transfer matrix corresponding to the sensor. For example, the covariance matrix can provide the uncertainty in the transfer matrix vector of parameters that corresponds to a particular sensor. In an embodiment, changing the operation level of one actuator more than another can reduce the elements of the covariance matrix corresponding to that actuator because there will be more information about how that actuator affects sensors.

In one embodiment, initialization of the transfer matrix TM can be performed according to the following method. Some of the following steps may be optional.

In step 1, a covariance matrix COV is set to a diagonal matrix with diagonal entries equal to $10^6$. In step 2, the transfer matrix values TM are set to zero. In step 3, all actuators (which may be equivalent to an entire module) are turned to 100% or some other common value. In step 4, the "before" temperatures are recorded. In step 5, a first actuator is turned down or off.

In step 6, the initialization waits until a configurable timer times out (e.g. with a default of 15 minutes), a quasi-steady state condition is reached, or a cold aisle temperature exceeds a limit (e.g. with a default of 87 degrees F.). In step 7, the "after" temperatures are recorded. In step 8, the temperature changes dY are computed.

In step 9, a learning update is performed. In one embodiment, a learning vector L is computed as $$L = COV * du / (\lambda + du^T * COV * du) \qquad (Eq. 11)$$

and the covariance matrix is updated using $$COV = (I - L * du^T) * COV / \lambda \qquad (Eq. 12),$$

where du is the vector of changes in the input control commands (or alternatively a change in an output level), and I is an identity matrix, and λ is a forgetting factor. In one aspect, λ can be "1" during initialization. The matrix can be made to be symmetric, e.g., by setting the below-diagonal elements to the above diagonal elements.

The transfer matrix can also be computed by computing prediction errors and then updating the rows of TM, which may be done for all columns or just the columns corresponding to the actuators that have been changed. In one embodiment, the error for sensor $S_{indx}$ is $e = dY(S_{indx}) - TM(S_{indx},:) * du$, and the new TM matrix elements are TM(sindx,:) = TM(sindx,:) + (L*e) across all columns or just the columns for the actuators that have changed.

In step 10, the first actuator is turned back to the previous level, and the second actuator is turned off or down. In step 11, a time is waited, e.g., as in step 6. In step 12, the "after" temperatures are recorded. In step 13, the temperature changes dY are computed. In step 14, a learning update is performed, e.g., as described above in Step 9. In step 15, the next actuator is turned back to its previous level, and the next actuator is turned down of off.

In step 16, the process can then go to step 11 for subsequent units until they have all been cycled up/down or on/off. The last actuator may be cycled up/on by itself, just as the first actuator was initially cycled down/off by itself. In step 17, the trace of the final covariance matrix can be stored as $Tr_{final}$. In some embodiments, more than just one actuator is cycled up at a time, and more than one actuator is cycled down at a time.

A similar or same process can be implemented for updating the matrix elements while the system is controlling the environment. Such a process can be performed when any change is performed on an actuator, e.g., as described above for methods 500-900.

In step 101, it is determined which actuator(s) to change. In step 102, the "before" temperatures are recorded. In step 103, the operation level of the actuator(s) is changed. In step 104, a time is waited, e.g., as in step 6 of the above method. In step 105, the "after" temperatures are recorded. In step 106, the temperature changes (dY) are computed.

In step 107, the change in operation level (du) is computed. In step 108, a learning update is performed, e.g., as described above in Step 9, where λ can equal 1.0. In step 109, the vector of prediction errors is computed as E=dY−TM*du. In step 110, the mean absolute prediction error $|E|_1$ and the maximum absolute prediction error $|E|_\infty$ are computed. In step 111, the size of the prediction error as the weighted average $|E|_1$ and $|E|_\infty$ is computed as $\|E\|w*|E|_1+(1-w)*|E|_\infty$.

Figure 10:
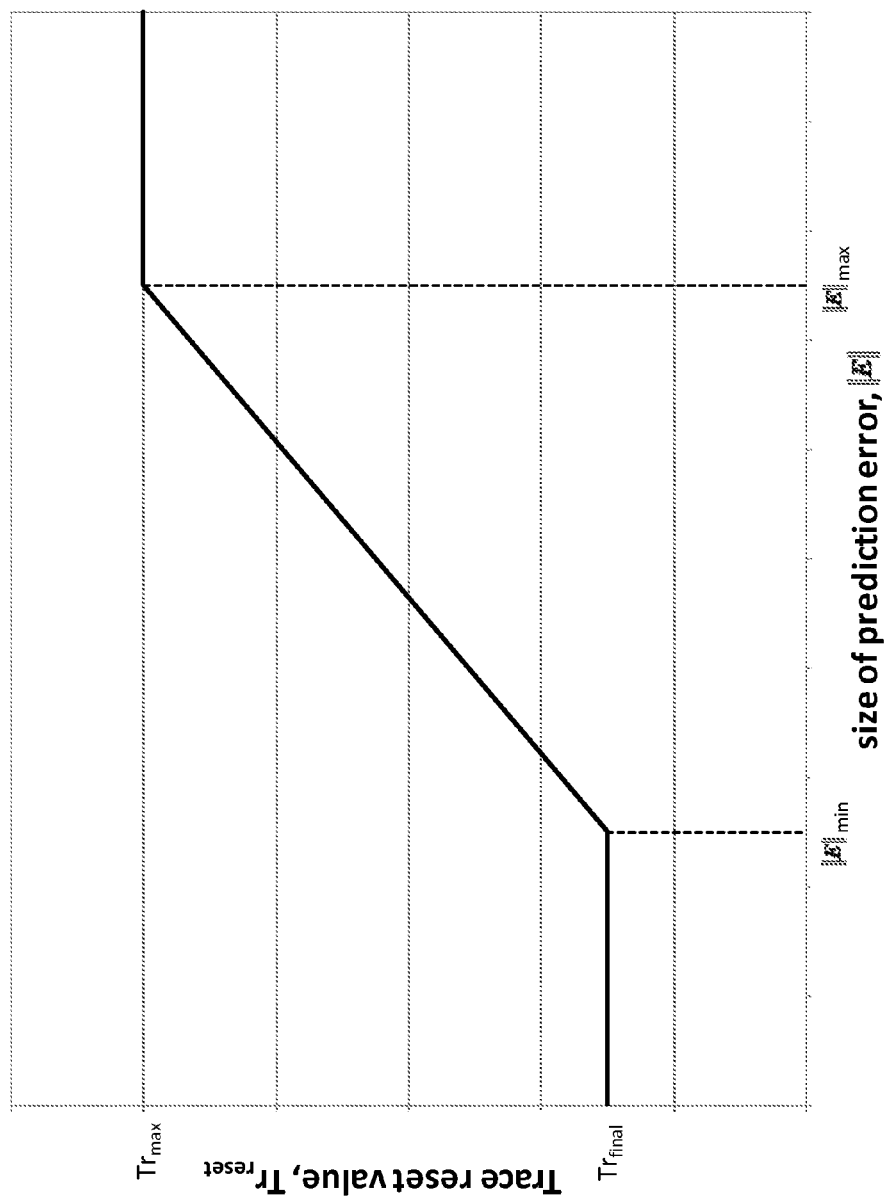
FIG. 10 is a plot showing an equation for updating the trace of the covariance matrix based on a size of a prediction error.

In step 112, a reset value for the trace of the covariance matrix is determined from an equation that links the size of prediction error to the reset value of the trace. FIG. 10 provides an example of such an equation. In step 113, the trace can be updated by scaling each of the existing values by a same multiplier such that the trace equals the reset value. In one embodiment, the covariance matrix is reset so that its trace equals the trace reset value as follows: COV=COV*$Tr_{reset}$/trace(P). In step 114, the process repeats to step 101.

IX. Penalty Function

As mentioned above, the operational parameter for a particular actuator may have different operation values (levels, settings, etc.), each resulting in a consumption of different amounts of energy. This varying use of energy (e.g. electricity, steam, natural gas, etc.) can increase the costs of operating the system. Furthermore, the energy use for each of the actuators can vary among the different types of actuators, and even within a particular type of actuator. The cost of running an actuator can also be dependent on maintenance costs, which can also vary depending on settings of an actuator. Thus, to account for cost (e.g., energy and/or maintenance) of running an actuator can be quite complicated, particularly when a desired sensor range is also desired.

In some embodiments, a penalty function is used to determine an optimal change dU to the actuator state U (operation levels). The penalty function can include one or more of the various contributions, such as a sensor contribution that increases the penalty when sensor readings are out of range, a cost contribution that increases based on energy usage and/or maintenance costs for running at a particular setting, and a stability contribution that discourages large changes in the actuators. The optimal change dU, as calculated from an optimization of the penalty function, can be used directly to change the actuators or be used in an additional function to provide the final change to the operational levels U. Such a method of determining a change in the operational parameters can be combined with any other methods mentioned herein.

Accordingly, the penalty function P can include penalties for out of range sensor readings. The penalty for an out of range sensor reading can increase as the sensor becomes more out of range. The penalty function may be constructed to not penalize readings from sensors that have a status indicator that they are faulty or unreliable. The penalty function may also be constructed so that a configurable number of sensor readings that are most out of range are not included in the penalty function. This non-inclusion of the most out-of-range sensors can serve the purpose of not penalizing readings from sensors that may either be faulty but not diagnosed as faulty, or that may be improperly located.

The penalty function P can also include an estimate of the power consumption of each actuation command. For example, the power consumption of fans has a theoretical relationship to the cube of fan speed. The relationship between fan speed, flow, pressure, and power is commonly called a fan affinity law. If fan speed is an actuation command, and if the power consumption of a fan at full speed is known, then the fan affinity law can be used to estimate fan power after the fan speed has been changed. For example, if an operational level $U_i$ is the setting for the fan speed, then a cost can be proportional to $(U_i)^3$. Each actuator can have a different function for its cost contribution. Thus, the operational level $U_i$ can be an input into a function $C_i$ to obtain the cost $c_i=C_i(U_i)$.

The penalty function also can have penalties for control actions that have non-energy costs. For example, starting or stopping a CRAC unit may have a maintenance cost associated with it. For instance, starting may cost a penalty. Also, running fans or other actuators may decrease the life of certain parts, and such a decrease in the life of the part can depend on the operational parameter for the actuator. Thus, the cost can be an overall cost of operation.

In one embodiment, the optimized values for the operation levels are constrained. For example, the optimized operation levels may not be allowed to be zero, e.g., where everything is off. Such a constraint may be a hard constraint (e.g. such values are not allowed). In another implementation, the constraints are included in the penalty function and cause a higher value, thereby not providing a minimum at certain points (e.g. no minimum at zero). Such constraints can be considered soft constraints. These other penalty function terms (some or all may be called penalty function terms) may be created from the transfer matrix TM that is used to predict sensor values. When the sensor values are far from a reference value then the term becomes larger. The increase in this term can be non-linear, e.g. exponential. The exponential increase may not occur until the difference is large enough (e.g. greater 10 degrees), but be linear when the sensor value is closer (e.g. within 10 degrees).

As mentioned above, the penalty function can be a function of the operational parameters U of the system. In various example, the operational parameters may be an input to each respective actuator of the system, an input that is provided collectively to a portion of the actuators, or an input to all of the actuators. For example, each fan of the different modules can be run by the same operational parameter, which would be an input that corresponds to one portion (set) of the actuators. Another operational parameter can control each chilled water valve of each module. Alternatively, a fan or valve for each module can be controlled independently.

In one embodiment, the optimal change dU can be determined from a minimization of the penalty function P. In order to estimate the value p of the penalty function will be, the transfer matrix TM can be used to estimate the resulting sensor values S. This estimate can be used to determine the penalty value p for a particular change dU. Thus, an optimal dU (at least according to some stopping criteria) can be determined from a current measurement of the sensor value.

Figure 11:
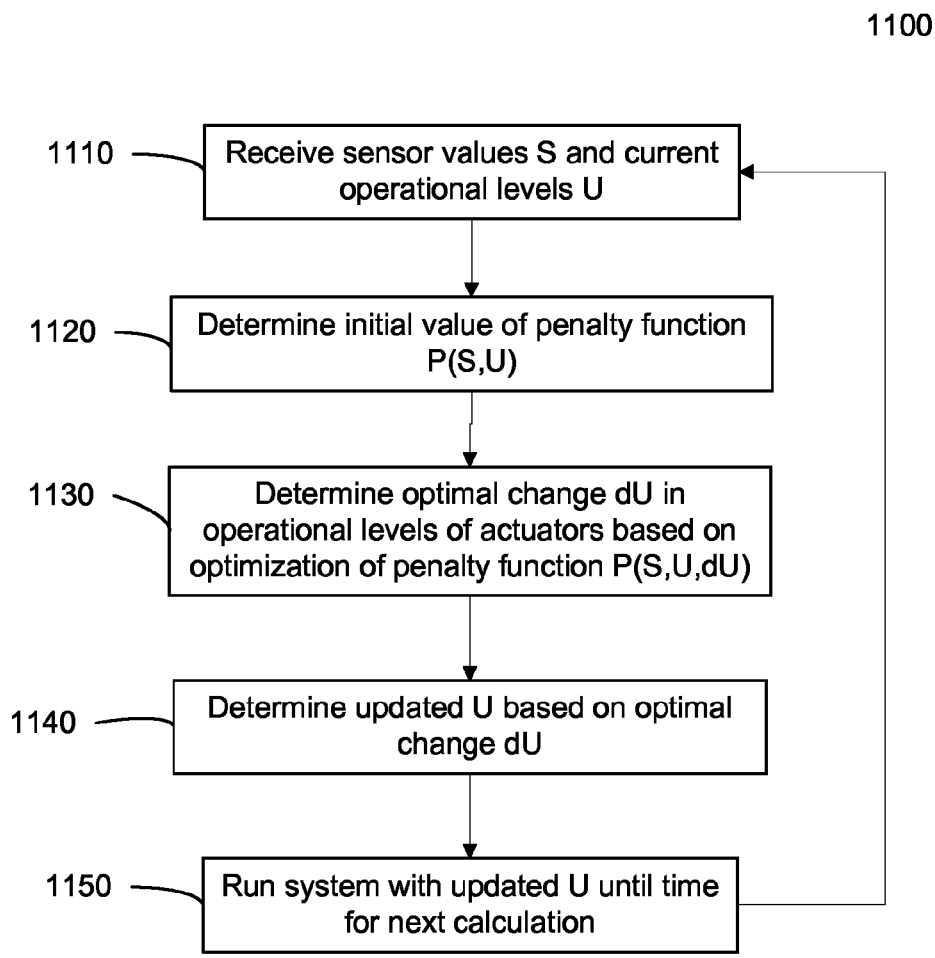
FIG. 11 is a flowchart of a method 1100 for controlling an environmental maintenance system using a penalty function according to embodiments of the present invention.

FIG. 11 is a flowchart of a method 1100 for controlling an environmental maintenance system using a penalty function according to embodiments of the present invention. Method 1100 can be implemented with supervisory controller 15 of FIG. 4. In step 1110, feedback of the sensor values can be received. In step 1120, an initial value of the penalty function P is determined.

In step 1130, an optimal change dU in the operational levels is determined by optimizing (e.g. minimizing) the penalty function P, which is a function of the sensor values S, the current operational state U of the actuators, and a potential change dU. Additional details for examples of optimizing P are provided below. In one aspect, the optimal change dU is optimal simply because it reduces the value of the penalty function P. Different dU of a group may be tried in an optimization method to determine the dU of the group that has the lowest value for the penalty function P.

Regarding the optimization, assuming that U is a vector that represents the operation levels (values) of the parameters, the penalty function P can output a single value C. Thus, in one embodiment, the penalty function can be represented as P(U) for a given set of operation levels. As described herein, a transfer model (e.g. a transfer matrix) can be used to relate U to the sensors S, (where both are used in the determination of P), thus U can define the system. The function P(U) can be minimized to find the U that corresponds to the minimum value for C. Equivalently, a penalty function P could be created where the maximum (instead of the extrema of a minimum) could be used. The extremum could be a local extremum. Any suitable optimization methods may be used. For example, gradient methods or simpler error difference methods can be used to find the extrema. In one embodiment, a global optimization method such as stochastic methods (e.g. simulated annealing and Monte Carlo), deterministic methods, heuristic methods, or other suitable methods can be used.

In step 1140, an updated operational state $U_{upd}$ is determined from the optimal $dU_{opt}$. For example, an updated operational state $U_{upd}$ could be taken as $U+dU_{opt}$. As another example, $U_{upd}=\lambda U+(1-\lambda)(U+dU_{opt})$, where $\lambda$ is a mixing coefficient. In step 11150, the system is run until the next update of U.

As mentioned above P can include various contributions. For example, P can equal $P_E+P_S+P_M$+other terms, where $P_E$ is the energy contribution, $P_S$ is the penalty for difference in sensor values, and $P_M$ is the penalty for extra maintenance costs for making changes (e.g. starts and stops). In one embodiment, maintenance cost has different costs associated with at least two ranges of operation levels. Any contribution of a particular type can be composed of an aggregation (e.g. a sum, weighted sum, or other function) from portions for respective sensor values or respective U values.

$P_S$ can be determined by comparing the sensor values S with the reference values R, as is mentioned above. Each sensor value can be compared to one or more reference values. For example, $S_i$ for a particular sensor can be compared to $R_i$ (e.g. to see if the sensor value is out of range) and the difference can be aggregated (e.g. a sum) along with partial contributions from other sensors. The difference can be multiplied by a proportional factor (e.g. a gain) before aggregation to obtain the partial contribution. For instance, a difference of a temperature from a setpoint can be multiplied to obtain the contribution of the penalty for that particular sensor. Below is sample pseudocode for one example of computing $P_S$ (slightly different notation is used), whose general structure can be used for other contributions.

```
S_Penalty = 0;
foreach sensor i
    if ((Snew(i) - R(i)) > 0)
        S_Penalty = S_Penalty + (Snew(i) - R(i)) * S_Gain; // add up all the
sensors over the setpoint. Here, S_Gain is simply a constant multiplier
weight
    end if
end for
```

In a more general sense, the partial contribution $P_S(S_i)$ to $P_S$ for a particular sensor can be a function, where the function can be based on $R_i$. For example, the function $P_S(S_i)$ can be for any value less than a setpoint, and then increase in any desired fashion for values of $S_i$ greater than $R_i$. As an alternative for comparing against multiple reference values, the function can be positive for values less than a particular range (e.g. a desired temperature range), zero within the range, and positive for values greater than the range, with the positive values on either side of the range potentially having different functional forms. Each of the contributions $P_S(S_i)$ may then be used to determine the overall value for $P_S$, e.g., by summing.

Accordingly, a measured value of S can be used to determine $P_S$. In one embodiment, to determine $P_S$ for each of various values of dU during an optimization method, the transfer matrix TM may be used. For example, $S_{new}=S+TM*dU$, and then $S_{new}$ may be used to determine the new $P_S$ corresponding to the dU.

In a similar manner, $P_E$ can be determined from the settings $U_i$ of each actuator. The $U_i$ can be input into a function that correlates the operational level to an energy cost (e.g., cost of electricity). As mentioned above, the function could include a term of the form of the cube of $U_i$, e.g., $P_{Ei}=aU_i^3$+other terms. The total value $P_E$ can be obtained from an aggregation of the portions $P_{Ei}$. In one implementation, $P_E$ can account for a current price of electricity (or whatever energy is being used, such as fuel). For example, $P_{Ei}=(0.05+0.95*(U_i{}^3))*$price per kilowatt. In one aspect, the 0.05 can be considered a minimal energy use to have the actuator plugged in. Note that the relationship between the operational level and the energy cost could be of any functional form (e.g. exponential, quadratic, etc.).

In one embodiment, to determine $P_E$ for each of various values of dU during an optimization method, a computer system can compute a new U. For example, $U_{new}=U+dU$. The $U_{new}$ can then be used to determine the value of $P_E$ that corresponds to a particular change dU. $P_M$ can be determined in a similar manner as $P_E$. As both $P_E$ and $P_M$ are dependent on the state of U, a contribution $P_U$ dependent on the state U can equal $P_E+P_M$.

Other contributions to the penalty function can include a penalty $P_{dU}$ for the amount of change dU. The penalty can penalize large changes in U. In this manner, the method can be made more stable. In one embodiment, the value of $dU_i$ is compared to a limit $du\_Limit_1$. Another contribution can be a penalty for $U_i$ exceeding a lower or upper limit. An example for a limit on U is when controlling temperature set point (an example of an operational level), this temperature set point should not go below a given lower limit, or else condensation can form, which can cause additional energy for cooling (and cleaning up the condensation). Thus, the function could be positive below a lower limit, zero between the limits, and positive above the limit. The positive contributions could simply be the different multiplied by a gain term, or have more complicated functional forms.

Any of the contributions to P may be made up of individual terms for each actuator or sensor, as the case may be. For example, $P_{E,J}$ can provide a mapping of an operation level J to an energy consumption. The mapping may be non-linear. The mapping can be a matrix, which may provide linear coefficients of non-linear functions. In one implementation, a mapping matrix in $P_E$ (or other functional part for $P_E$) can be updated by sampling some data points and determining the coefficients that fit the functions to the parameter-energy consumption relationship for each parameter.

The $P_E$ term can help to down the energy consumption. But as this is happening over time, a boundary can occur where they cannot be driven down any further. One boundary is the S cost for exceeding set points. While in this boundary region, there can be an optimal setting for U (assuming our model is correct). Other contributions can refer to boundary limits of the actuators or how much they are allowed to change any given time.

Figure 12:
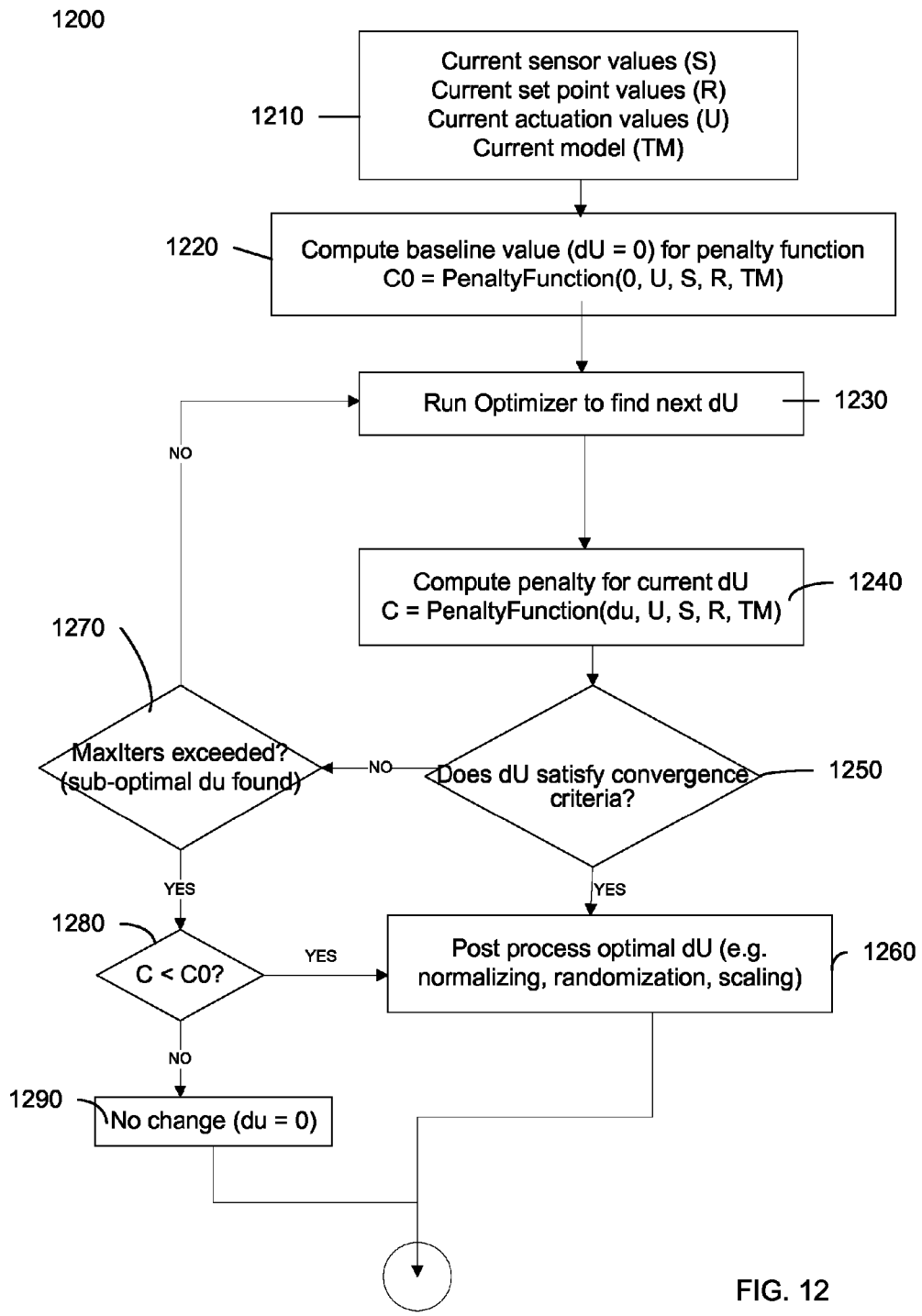
FIG. 12 shows a flowchart illustrating a method 1200 for controlling an environmental maintenance system according to embodiments of the present invention.

FIG. 12 shows a flowchart illustrating a method 1200 for controlling an environmental maintenance system according to embodiments of the present invention. In step 1210, data about the system is received. For example, current sensor values S (such as current set of environmental measurements—e.g., server inlet temperatures), current set point values R (such as current set of reference values per measurement—e.g., cold aisle set points), current actuation values U (such as current actuation state per actuator—e.g., fan speed), and current model (e.g. transfer matrix TM) can be received. Other data can also be received, such as: the acceptable limit of actuation change per actuator (which may differ per actuator); upper/lower limits of actuation per actuator (which can be the same for each actuator)—e.g., 0%/100% fan speed; cost multipliers to be used in determining a particular penalty contribution—e.g., for fan speed constraints, inlet temperature constraints; and a set of each actuator parameters needed to compute lowest energy cost at a given actuation value (e.g. the 0.05 value above for $P_{Ei}$).

In step 1220, an initial value C0 for the penalty function. This initial value can be considered a baseline value in that dU is taken to be 0 for this initial value. The initial penalty value can be written as C0=PenaltyFunction(0, U, S, R, TM). As mentioned above, one contribution to the penalty can be for exceeding reference values for respective sensors. Other contributions can be for actuation values exceeding lower/upper actuation limits for respective actuators and for actuation value cost of energy for all actuators.

In step 1230, an optimizer routine is run to find next dU. This next dU is a possible change to the actuators in an attempt to find an optimal dU as determined from the penalty function. Ideally, the optimal dU minimizes the penalty function based on the current U, S, and R, using the model TM. The dU can define the actuation change for each actuator from the current state U. In one embodiment, the value of dU can be understood as a vector for searching the variable space to find the U that minimizes the penalty function. For example, a gradient method (e.g., conjugate gradient) can be used to determine a best direction for dU. In one implementation, to determine the appropriate length, an approximation (e.g. quadratic approximation) can then be used for a scalar on the direction of dU. In another example, dU is determined using a simplex method, such as the Nelder-Mead method.

In one embodiment, the value of dU can be constrained to not be too large. For example, there can be a penalty for exceeding an input change limit for all actuators. Such a constraint can provide stability to the system by keeping the changes relatively small. In one embodiment, if any change per actuator exceeds actuation change limit, then the difference is multiplied by the cost multiplier. A sum all this penalty for the actuators can be computed the cost to obtain this penalty contribution.

In step 1240, the penalty for the current dU is computed. For example, the general functional notation C=PenaltyFunction(du, U, S, R, TM) can be used. As mentioned above, one contribution to the penalty can be for the sensor values exceeding reference values R. As described above, the transfer model (e.g., a transfer matrix when the model is linear) can be obtained that predicts a temperature value (or change) based on a change in an operation value U. To determine the $S_{new}$, TM can multiply the actuation change dU to find the projected change in environmental measurements ($S_{new}$). In one embodiment, the penalty function for a sensor difference from reference values can be written as $P_S$(TM(U)), where TM(U) can output the sensor values as a vector S. The vector S can then be compared to reference values R. Thus, $P_S$ can be a function of R−TM(U+dU). For example, if any measurement exceeds its reference value, a computer multiply the difference by the cost multiplier. A sum for all the measurements that apply can be computed this penalty contribution.

For the penalty for energy use $P_E$, at the current projected actuation value for an actuator, the energy consumed is determined based on functions that may be specific to a certain type (or even model) of actuator. The state U of these actuators can be used to compute the total energy cost (e.g., using a kW rating for each actuator, such an affinity law for fan speed). An actuator-specific function may have more than one parameter to compute the energy cost, e.g., the operational level, the cost of electricity, an energy efficiency parameter, etc. To determine the new actuator state $U_{new}$, the method can add the actuation change to the current actuator state to get the projected actuation value. As with the other contribution, the energy costs could be summed over the actuators. In one example, if any new operational level exceeds a respective lower limit, the method can multiply the difference by the cost multiplier. An upper limit can also be used, as is described above. Other contributions not mentioned can be implemented un a similar manner.

The penalty functions can have hard or soft constraints on the optimal dU. A hard constraint is when the dU is not allowed to have certain values. A soft constraint is when dU is allowed to have certain values but the values cause ever increasing penalty values so that such dU values would be explored due to the high penalty.

In step 1250, it is determined whether the optimization method is converged. For example, it may be determined that the penalty value C has not changed significantly from one iteration to the next. As another example, it can be seen that two consecutive dU are similar enough (i.e., the adaptive step size is computed to be small). One skilled in the art will appreciate the various convergence criteria that can be used. If the convergence criteria is met, then the current dU is taken as an optimal dU.

In step 1260, if the convergence criteria is met, the optimal dU may be further modified. For example, the optimal dU can be normalized, randomized (e.g., by a small amount), and/or scaled. In one implementation, dU=rho*dU, where rho is a scaling factor. So in effect, $U_{new}$=U+rho*dU. For normalization, a normalize optimizer can compute dU relative to a maximum allowed actuation change limit. For randomization, the randomization can occur under a possibly random schedule. For example, a dU that does not minimize the penalty function, but does reduce it relative to the baseline, can be used. In one implementation, such a suboptimal decision can be taken at each predictive decision cycle with probability p. In another implementation, a suboptimal decision can be taken at each R predictive decision cycles. For scaling, a default can be to scale down by a configurable constant. In one aspect, rho may be determined based on an accuracy of the transfer model, e.g., using a regression table and Pearson correlation coefficient, which can be used as rho.

In step 1270, if the convergence criteria is not met, an optional step is to check whether the maximum number of iterations has been reached. If the maximum has not been reached, then method 1200 returns to step 1230 to select a new dU. If the maximum has been reached, the current dU may then be used, depending on certain criteria. In one embodiment, to apply randomization, the number of optimization iterations can be randomized such that it is less than the number that would be taken if a suboptimal decision were not being made.

In step 1280, it can be determined whether the current penalty value C is less than the baseline C0. If C<C0, then the current dU is at least better than no change at all. The process then may proceed to step 1260 to perform any post-processing. If C is not less than C0, then no change in U may be made at step 1290.

Figure 13:
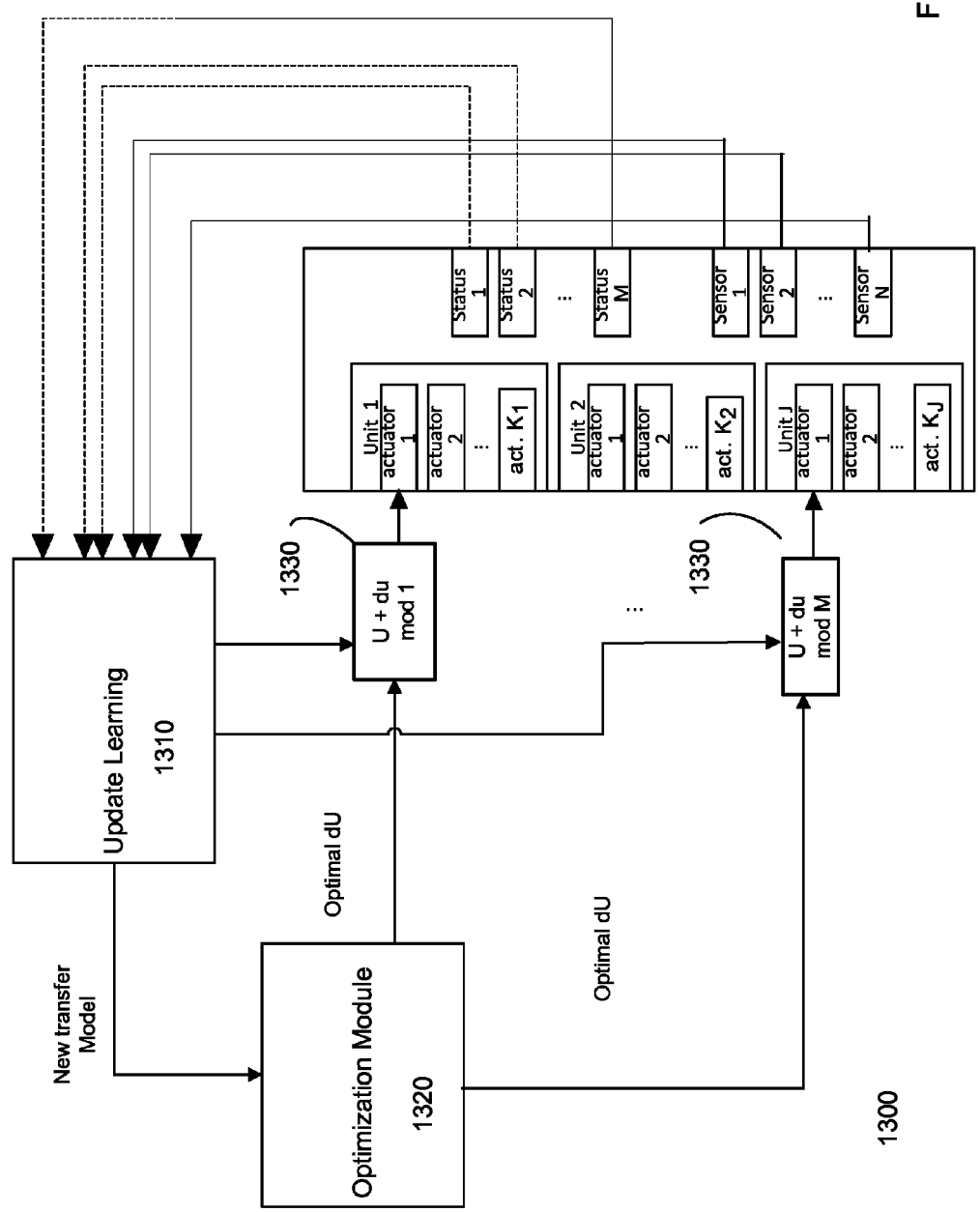
FIG. 13 shows a block diagram of a system 1300 for determining an optimal dU to be used in controlling an environmental maintenance system according to embodiments of the present invention.

FIG. 13 shows a block diagram of a system 1300 for determining an optimal dU to be used in controlling an environmental maintenance system according to embodiments of the present invention. System 1300 is similar to system 400 regarding the HVAC units, actuators, status indicators, and sensors. An update learning module 1310 can receive the status and sensor updates, and use them to update the transfer model TM, e.g., as described above. The updated transfer model can then be used by optimization module 1320 to determine an optimal dU.

The optimization module can receive the input (e.g., U and S) as mentioned above via the update learning module or through other connection not shown. The optimization module 1320 can use any of the penalty functions mentioned herein to determine an optimal dU. Modulators 1330 may be used to perform post-processing on the optimal dU, as is mentioned above. The output of these modules provides the new settings U for the actuators. Any of these modules may be its own circuit, combined with other modules on one circuit, or be a different software function implemented on a general purpose processor.

In one implementation, a current cost of electricity (or other energy source) is obtained via a network connection to an electricity provider or network. The optimization module 1320 can then use the cost of electricity in a function for determining a cost based on an operation level.

The update learning module 1310 can also determine an accuracy of the transfer model, which can be used in a post-processing step as implemented via modulators 1330. The following description provides more details and broader concepts about determining an accuracy of a transfer model and using the accuracy to determine a new U.

In one embodiment, there can be two iterative loops. The higher frequency loop is the feedback loop that determines operation levels based on measured differences in the sensor values and a slower frequency loop that determines the optimized values. For example, the predicted operation levels as determined by the optimization module 1320 could be input at a first frequency (e.g. every 15 minutes) and in between such inputs, the feedback from the sensors can be input into a simpler model (e.g. into a model that uses the inverse of the TM and/or different proportional-integral-derivative (PID) objects as described in Federspiel I and FIG. 4) to determine the inputs to the actuators at a second frequency (e.g. every 15 or 30 seconds).

X. Using Accuracy of Transfer Model

As just mentioned above, embodiments can scale a change dU (e.g. an optimal change) in individual control commands (i.e. to set operational levels) or a cumulative size of the control commands based on the size of a prediction error. Such embodiments can be used regardless of the method for determining a change in dU, including feedback methods in U.S. patent application Ser. No. 12/396,944. For example, modules 1330 can scale the cumulative size of the optimal control commands so that as the prediction errors get larger the predictive control actions are used less. In one aspect, a Pearson correlation coefficient is used to determine the prediction errors in the transfer model.

Figure 14:
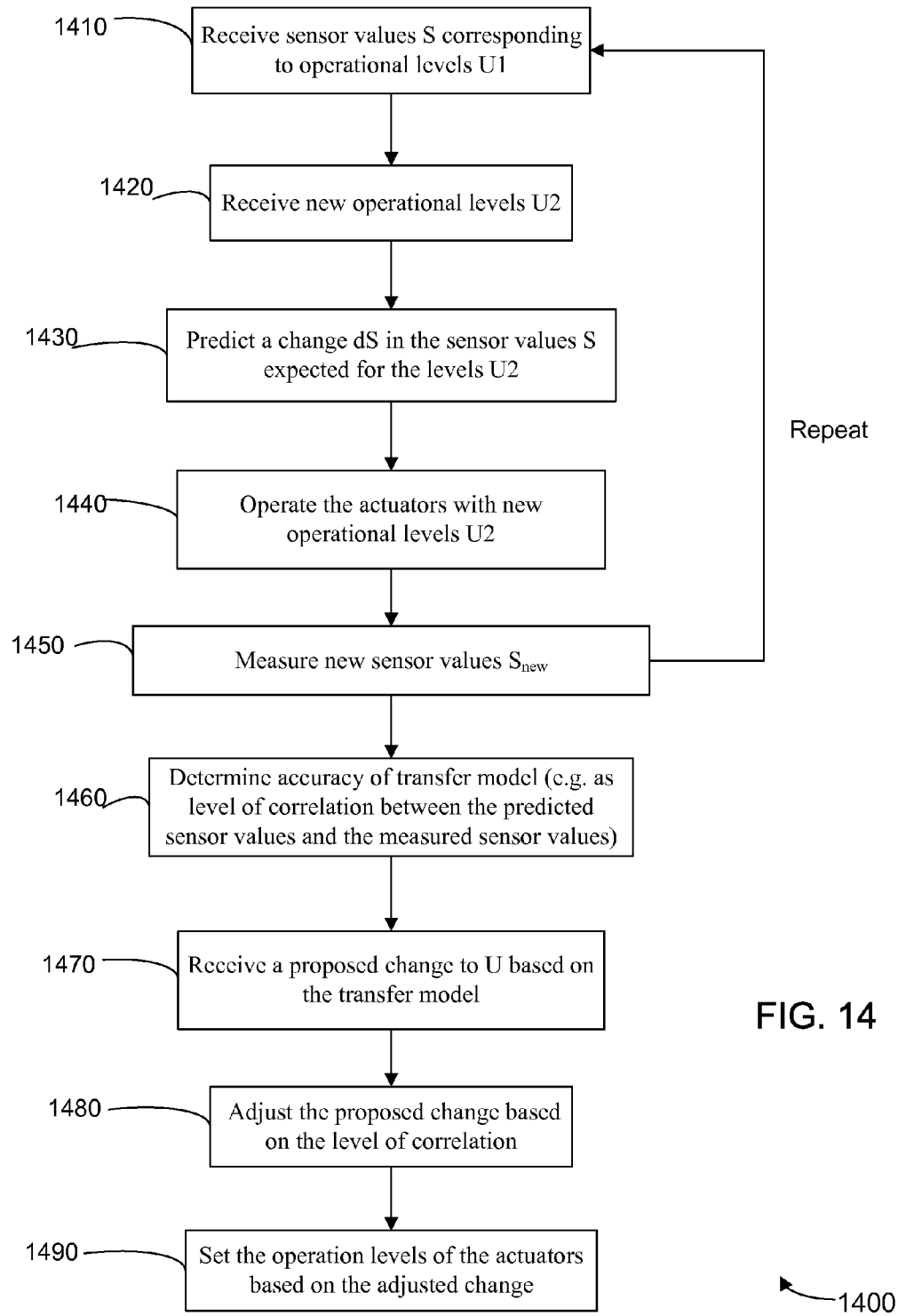
FIG. 14 shows a flowchart illustrating a method 1400 for controlling an environmental maintenance system using a measure of accuracy of a transfer model according to embodiments of the present invention.

FIG. 14 shows a flowchart illustrating a method 1400 for controlling an environmental maintenance system using a measure of accuracy of a transfer model according to embodiments of the present invention. In step 1410, sensor values S are received (e.g., from sensors 3 of FIG. 4 or of FIG. 13). The sensor values S may be received by any processing device mentioned herein. The sensor values S corresponding to first operational levels U1 of the actuators.

In step 1420, new operational levels U2 of the actuators are received. The new operational levels U2 and the first operational levels U1 different by a change dU. The new operational levels U2 may be computed in various way, and may be determined as a change dU that is added to U1. As one example, optimization methods 1100 or 1200 may be used, or feedback methods of U.S. patent application Ser. No. 12/396,944 may be used.

In step 1430, a change dS in the sensor values S is predicted. The change dS corresponds to the change dU. The change dS can be computed simply as new sensor values, thereby implicitly calculating the change dS. As another example, dS can be computed directly from dU. The prediction is performed in accordance with a transfer model. For example, dS=TM*dU can be used, which can be written as S2−S1=TM(U2−U1).

In step 1440, the actuators are operated with the new operational levels U2, e.g., for a fixed amount of time. As the new operational levels U2 will typically differ from the first operational levels U1, the sensor values should change. In step 1450, new sensor values Snew are subsequently measured. Note that the new sensor values may not be the same as the predicted values due to the transfer model not being perfectly accurate. Steps 1410-1450 can be repeated to obtain many sets of predicted sensor values and the corresponding measured values at a plurality of different times. This data can be stored in a memory for future use. Note this data can equivalently be stored as dS (a measured difference) and dS' (a predicted difference). Such a table of data points can be called a regression table.

In step 1460, a metric of accuracy of the transfer model can be determined (e.g., as a level of correlation between the predicted sensor values and the measured sensor values is determined). The metric can provide a measure of how accurate the transfer model has been over the data points obtained in steps 1410-1450. The metric can be determined in various ways.

For example, a linear relationship (e.g., S_predicted=$\alpha$S_measured, where $\alpha$ is the slope) and an error of the data points (S_predicted,S_measured) relative to the linear relationship is measured, e.g., using lest squares. Thus, the differences between predicted and measured values can be aggregated to obtain a total error value. A magnitude of this error can then be used to determine a level of correlation. The error can be normalized to obtain the correlation. In one embodiment, the Pearson correlation coefficient is used.

As mentioned above S is a vector, and thus corresponds to a multidimensional data point. Thus, S_predicted−S_measured is also a multidimensional data point. In one embodiment, the absolute value of the differences can be summed as part of determining the correlation. In another embodiment, the data point (S_predicted,S_measured) for each sensor can be compared to an assumed functional relationship (e.g. linear, which may have an offset). Each sensor can have a different functional relationship, e.g., a different slope and offset, or they could be the same.

In step 1470, a proposed change (e.g., an optimal dU) to the operation levels of the actuators is received. The proposed changed is based on the transfer model. For example, the proposed change can be determined using an optimization method to minimize a penalty function, as is described herein. As another example, the transfer model can be used as a transfer matrix, which can be inverted, to determine how the actuators should be changed based solely on the purpose of keeping the sensors within set points.

In step 1480, the proposed change to the operation levels of the actuators is adjusted based on the level of correlation. For example, an optimal dU can be scaled by the Pearson coefficient. In this manner, if the transfer model is accurate, then the optimal dU be used directly (Unew=U+dU), or at least most of it (Unew=U+rho*dU, e.g. with a scaling coefficient rho of 0.8 to 1.0). However, if the transfer model is proving to be inaccurate, the scaling coefficient rho can be small (e.g., less than 0.1) or even zero.

In one embodiment, the adjustment can be achieved by changing a parameter in the penalty function. For example, lower and upper limits for operation levels of an actuator may be modified. Such changes can affect a particular penalty contribution, which can cause a proposed dU to be modified in order to reduce the penalty caused by dU exceeding this limit. For instance, assume that the transfer model is shown to be accurate, then the upper limit can be reduced so that energy is saved, while keeping the sensors in line with set points since the model is accurate. If the model is not accurate, then the penalty function may not want to restrict the operational levels U, since such a constraint may cause the sensor values to exceed their set points due to errors in the model.

In step 1490, the operational levels of the actuators are set based on the adjustment to the proposed change. In this step, Unew is calculated, e.g., as provided above via formula Unew=U+rho*dU, where rho*dU is the adjusted change. In other example, rho*dU may be scaled, offset, or otherwise modified again before adding to U. Such a scaling may occur based on extremum or midpoint settings for a particular actuator or group of actuators, which is described in more detail below. In yet another example, rho*dU and U can be input into a function that determines Unew.

Figure 15:
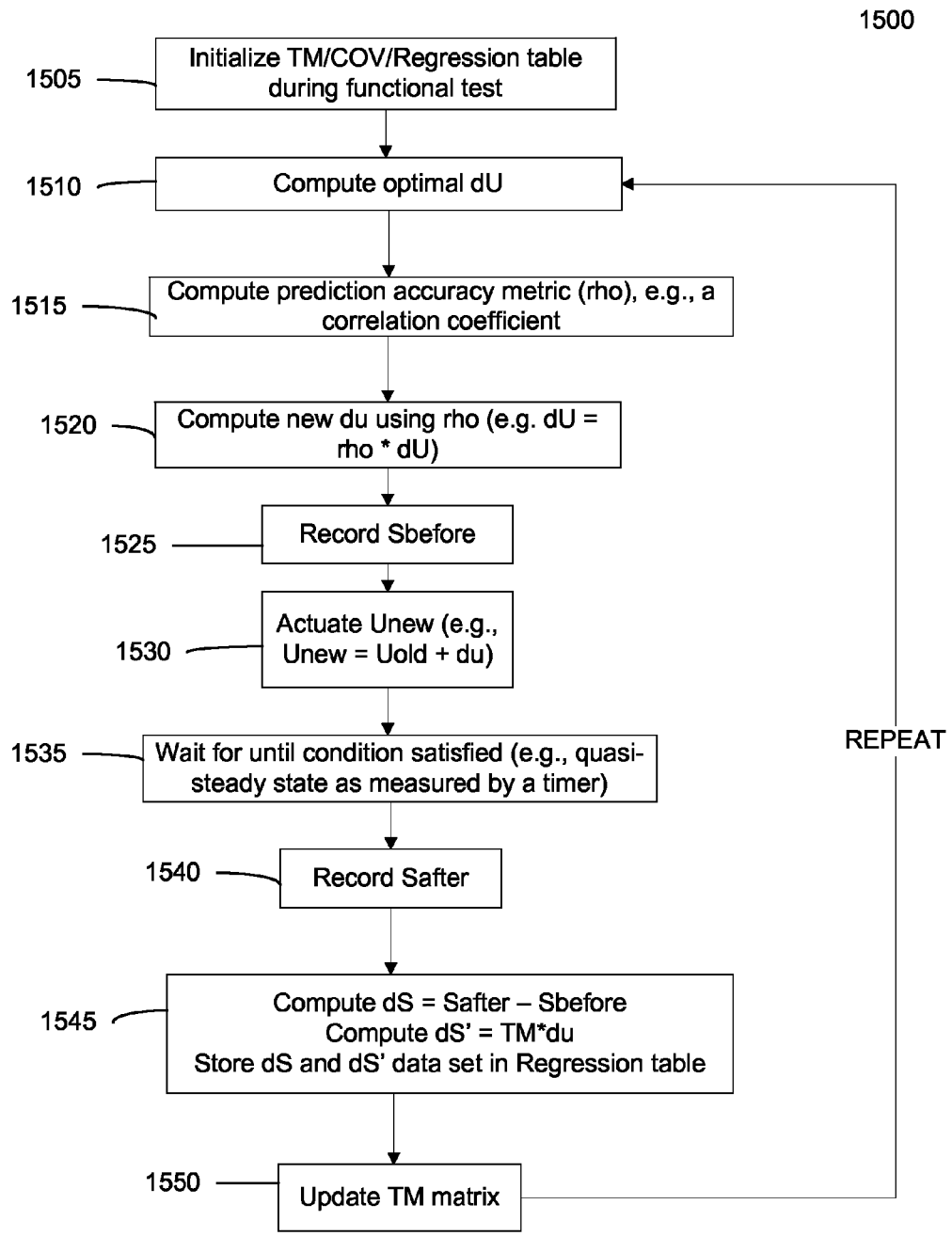
FIG. 15 shows a flowchart illustrating a method 1500 for controlling an environmental maintenance system using an accuracy of a transfer model according to embodiments of the present invention.

FIG. 15 shows a flowchart illustrating a method 1500 for controlling an environmental maintenance system using an accuracy of a transfer model according to embodiments of the present invention. In step 1505, the transfer model TM, covariance function (e.g. a covariance matrix) for updating TM, and a regression table are initialized, e.g., during a calibration test. The regression table can have one column for estimated (or predicted) sensor values and another column for the actual measurements. In another example, a difference in measurements can be in one column and the predicted difference can be stored. Each row of the table can correspond to a new update event.

In step 1510, an optimal dU is computed. In one embodiment, the dU can be computed using any optimization of any of the penalty functions mentioned herein. Other embodiments can use a PID object. In one embodiment, a PID object 11 calculates three separate parameters: the proportional, the integral and derivative values. The proportional value determines the reaction to the current error, the integral determines the reaction based on the sum of past errors, and the derivative determines the reaction to the rate at which the error has been changing. The weighted sum of these three actions is used to adjust the process 16 via a final control element or data point, such as the position of a control valve, the power supply of a heating element, or the speed of a motor drive, or to reset a setpoint of an embedded (local) digital controller of an HVAC unit. Further details are provided in application Ser. No. 12/396,944.

In step 1515, the prediction accuracy metric rho (e.g. a correlation coefficient) is computed. In one embodiment, rho is a Pearson correlation coefficient (rho) of predicted vs measured sensor data using a sliding window of past data sets stored in the regression table. The window may be used so that the table does not become too large (e.g. only the last 10,000 data points might be stored and used). A user may be allowed to define the window. In one implementation, if rho<0, then set rho=0. Optionally, a configurable factor can be used instead of zero, or instead of rho when there is not sufficient data to determine the correlation.

In one embodiment, the Pearson correlation coefficient (or any other prediction accuracy metric) can provide an estimate of how accurate and precise the estimated vs measured data is. In a two-dimensional plot, one axis is the estimated, the other axis is the measured. If the plot is perfectly linear, the coefficient will be 1. If the plot is completely scattered, the coefficient will tend to 0 or negative. If negative, set the value to 0.

In step 1520, a new du is computed using rho, e.g., dU=rho*dU. In other embodiments, the correlation rho can be used to determine a scalar that is multiplied by dU. Or, both types of scaling can be performed. Other types of functions besides a scalar multiplier are also contemplated.

In step 1525, the values of the sensors $S_{before}$ is determined, i.e. before U is changed. In step 1530, the new U is actuated (i.e. the operational levels of the actuators are changed). The new U can be calculated as $U_{new}=U_{old}$ dU. In step 1535, the actuators are run until the system satisfies a condition, such as reaching a quasi-equilibrium state (e.g., until a timer expires). The timer could be 5, 10, or 15 minutes. In step 1540, the new sensor values $S_{after}$ are recorded.

In step 1545, the data points are stored in the regression table, which can be stored in a memory. In one embodiment, $dS=S_{after}-S_{before}$ is computed, and dS'=TM*dU is computed. The values for the dS and dS' data set can be stored in the regression table. In step 1550, the transfer model is updated, e.g., using a covariance matrix as is described above. The method can then repeat starting from step 1510.

XI. Modifying Midpoints and Extremums

The optimal dU obtained from a penalty function and the information about the accuracy of a transfer model used to determine a dU can each be used in a variety of ways. In one embodiment, the optimal dU may be used as a scalar that multiplies a feedback setting for the actuators. This feedback setting does not have to be based on the transfer model, e.g., the feedback setting can be based on simple heuristic feedback loops that operate on midpoint or extremum values of a sensor distribution (e.g., PID loops that operate on the average temperature or nearly-maximum temperature), as is explained below. In a similar manner, the accuracy of a transfer model can be used for midpoint or extremum methods, which do use a transfer model.

Accordingly, control actions based on feedback from sensor readings may be combined with predictive control actions. When the two are combined, the predictive control actions can be an offset and/or a scale factor that reduce the feedback control action. A single feedback loop is set up for the extremum control (e.g., response to the Nth highest sensor reading), and potentially a second feedback loop is set up for the midpoint control (e.g., average sensor reading). The predictive control actions affect the Mod blocks between a control action (that would otherwise go unmodified to all actuators) and the actuator. If the penalty function ignores the N readings that are most out of range, then the feedback control actions should also not respond to those N out of range readings.

Figure 16:
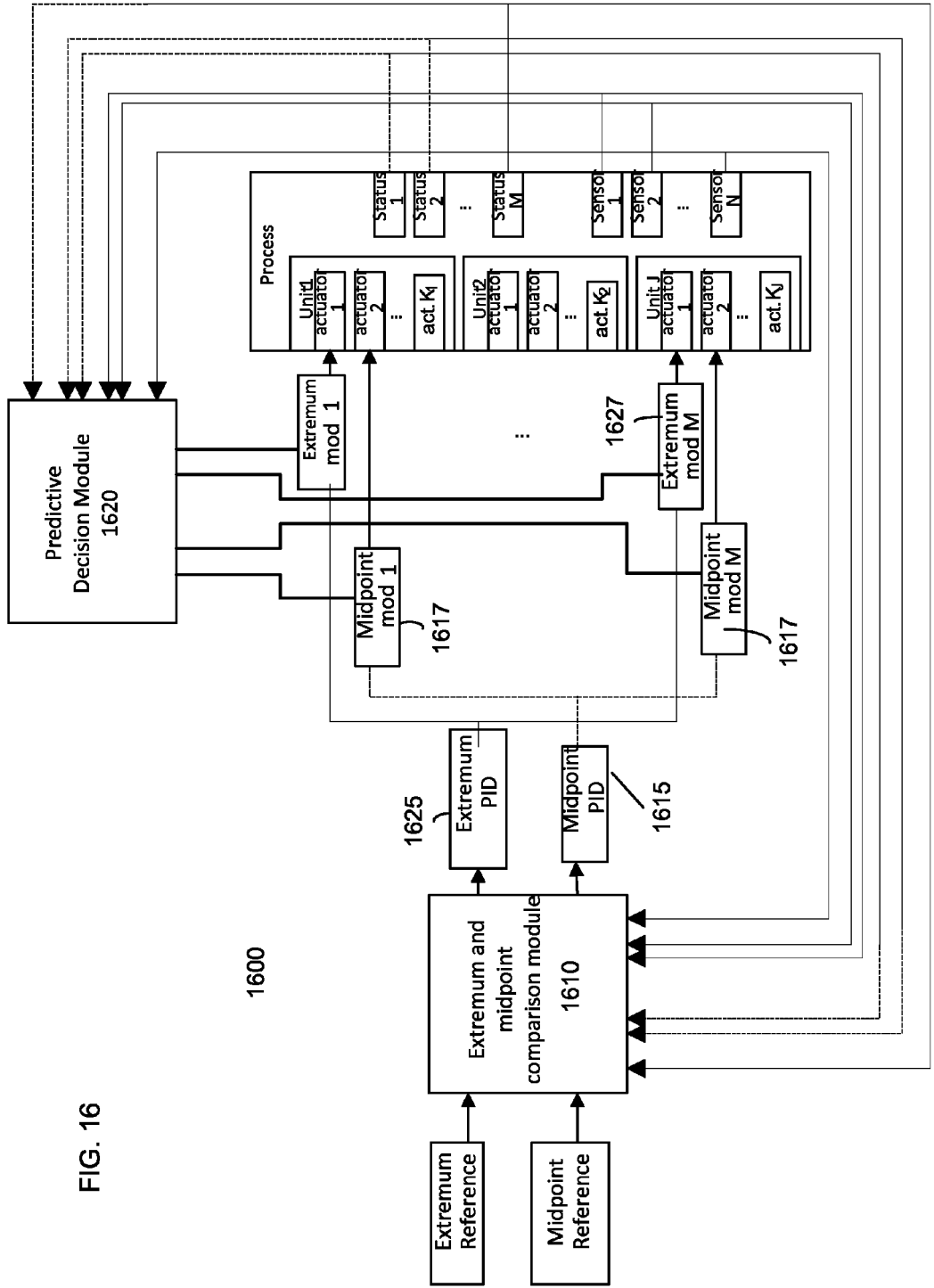
FIG. 16 shows a diagram of a system 1600 for implementing midpoints and extremum controls according to embodiments of the present invention.

FIG. 16 shows a diagram of a system 1600 for implementing midpoints and extremum controls according to embodiments of the present invention. System 1600 has an overall similar architecture as systems 400 and 1300. The sensor values are provided via two feedback mechanisms to an extremum and midpoint comparison module 1610 and to a predictive decision module 1620. Depending on the embodiment implemented each of these two modules can perform different functions. As described herein, any of these modules may be its own circuit, combined with other modules on one circuit, or be a different software function implemented on a general purpose processor.

In one embodiment, the predictive decision module 1620 performs an optimization using any of the penalty functions described herein. Module 1620 can provide an output of an optimal dU, e.g., as determined by embodiments of methods 1100 or 1200. Module 1620 can receive a current actuator state from the actuators or from a device that sends the settings to the actuators. The other feedback loop sends the sensor values to the extremum and midpoint comparison module 1610, which can calculate a midpoint (e.g., an average or median), extrema (highest/lowest) of the sensor values, and/or Nth highest or lowest (which can be considered an extrema or a midpoint, depending on the value of N).

The midpoint value can then be compared (e.g. a ratio or a difference) to a reference midpoint value. A result of the comparison can be used to determine a change value (which could be a new setting). For example, a simple linear (or other functional) model can relate a difference in the midpoint and the reference to an output value between 0% and 100% (or equivalently a change in an operational level) that provides the level of operation of all of the actuators. In one implementation, a midpoint PID 1615 can receive the output value and modify the output value based on previous output values. Regardless, the module 1610 and the midpoint PID (or any other mechanism that uses the midpoint value) can provide an operational level (which may be a change value) to midpoint modulators 1617. In one aspect, each modulator can receive the same value, which can result since the sensor values are being analyzed collectively.

In one embodiment, when both extremum and midpoint control are used, the predictive decision module 1620 can use a penalty for both exceeding an extremum of upper (and/or lower) limits and deviations of the midpoint of the sensor distribution from a desired level. In doing so, module 1620 can adjust the (typically common) individual PID commands for extremum control and (typically common) individual PID commands for midpoint control to achieve individual commands that minimize the penalty function while mitigating extremum sensor readings exceeding upper (and/or lower) limits and mitigating deviations of the midpoint of the sensor distribution from a desired level.

The midpoint modulators 1617 can provide output to certain actuators that are to be controlled via the midpoints of all of the sensors, or just some of the sensors. The midpoint modulators 1617 can adjust (e.g. offset or scale) a common received setting differently for the respective actuator that it controls. For example, midpoint modulator 1 provides a control output to actuator 2 of HVAC unit 1. A modulator 1617 can adjust the setting based on the dU value that is specific to the corresponding modulator. For example, if the dU value for the corresponding actuator is relatively small compared to the other dU values for the other actuators, the change in the setting may be decreased relative to the value received from the midpoint PID 1615. This is because the output of midpoint PID 1615 may be the same for all actuators; however, module 1620 knows that a particular actuator has a low impact on the high sensor values or will have higher cost to increase its operational level, or will keep the midpoint close to a desired level while allowing the $dU_i$ of another actuator to be larger, where this other actuator has a higher impact on the high sensor values. Thus, a change value from midpoint PID 1615 for the particular actuator should not be as high as for the other actuators, where a change value will more easily bring down (or up) the midpoint to a set point, or will do it cheaper.

Other actuators can be controlled in a similar manner via extremum controls. For example, module 1610 can identify a highest and/or lowest (or Nth highest/lowest) sensor value, which may be determined from the differences from respective setpoints. This extremum sensor value can be compared to a reference extremum value, and extremum PID 1625 can provide an operational setting, as described above for the midpoint analysis. The optimal dU can then be used to individually adjust the output of the extremum PID 1625 for the respective actuators that are being controlled via the extremum method.

In another embodiment, module 1610 can determine a proposed change to the actuators based on the transfer model, e.g., as described herein and in U.S. Non-Provisional application Ser. No. 12/396,944. The transfer model can be used to determine how the actuators should be changed based on the transfer model in order to make the midpoint or extremum of the sensor values be within the reference values. A different transfer model could be used depending on whether a midpoint or extremum is being used. The amount of change can be different for any particular actuator or a common amount for all. The determination can be respectively provided to the PIDs 1615 and 1625. In this embodiment though, the modulators 1617 and 1627 can adjust the setting based on an accuracy of the transfer model.

In one implementation, if the transfer model is determined to be accurate based on a comparison of predicted values to measured values (e.g. using the Pearson correlation coefficient), then the output of module 1620 (if no PID used) or from the PIDs can be used with little change, e.g., a small mixing factor. However, if the transfer model is not accurate, then the proposed change from the transfer model and mostly or entirely be ignored.

In another implementation, a scale factor of a modulator may be determined based on the accuracy of the transfer model. For example, a scale factor can be set at 80% in order to reduce energy costs. If the transfer model is accurate, the system should still be able to keep the sensor values within an acceptable range. Thus, this operational maximum can be moved lower with higher levels of accuracy of the transfer model. However, with low accuracy for the transfer model, the scale factor should be higher; otherwise the sensor values are likely to become out of range. Similarly, a scale factor for a midpoint of all of the operational values can be set based on the accuracy of the transfer model. A rationale is, if the accuracy of the model is good, methods can maintain the new adjustments as much as possible; otherwise, the system readjust them linearly from their present values to their respective maximums (or minimums).

In one embodiment, variable speed fans are used to change the extremum sensor value, and return air temperature or discharge air temperature sensor set point to regulate the average, median, or other statistical value. In another embodiment, there could be PIDs for each actuator with the attenuation of each PID output being potentially different. Thus, a modulator for each actuator. Also, an extremum PID can be used for a first actuator of each module (e.g. each fan), but the modulation for each of the set of first actuators can be modulated separately.

As an example for actuators affecting a discharge temperature from the cooling units, the system can affect the temperature of air being discharged (e.g., by adjusting a discharge temperature setpoint). The adjustment can be done based on the average (midpoint) of the rack temperatures. If the midpoint temperature is too high, then the system decreases the discharge air temperature setpoints, whose decrease can be based on dU or an accuracy of the transfer model. In a basic case, all of the discharge air temperature setpoints would be the same based on the midpoint model, and this common setting would be altered based on the relative dU values or by a same amount of the accuracy of a transfer model (although an accuracy for each actuator could also be isolated). As another example, regarding adjusting the speed of the fans of many cooling units, the midpoint (or even an extremum) can also be determined as the Nth highest rack temperature that exceeds a setpoint (or Nth lowest high-temperature error of the rack sensors, where error is setpoint minus feedback, is below zero).

Figure 17:
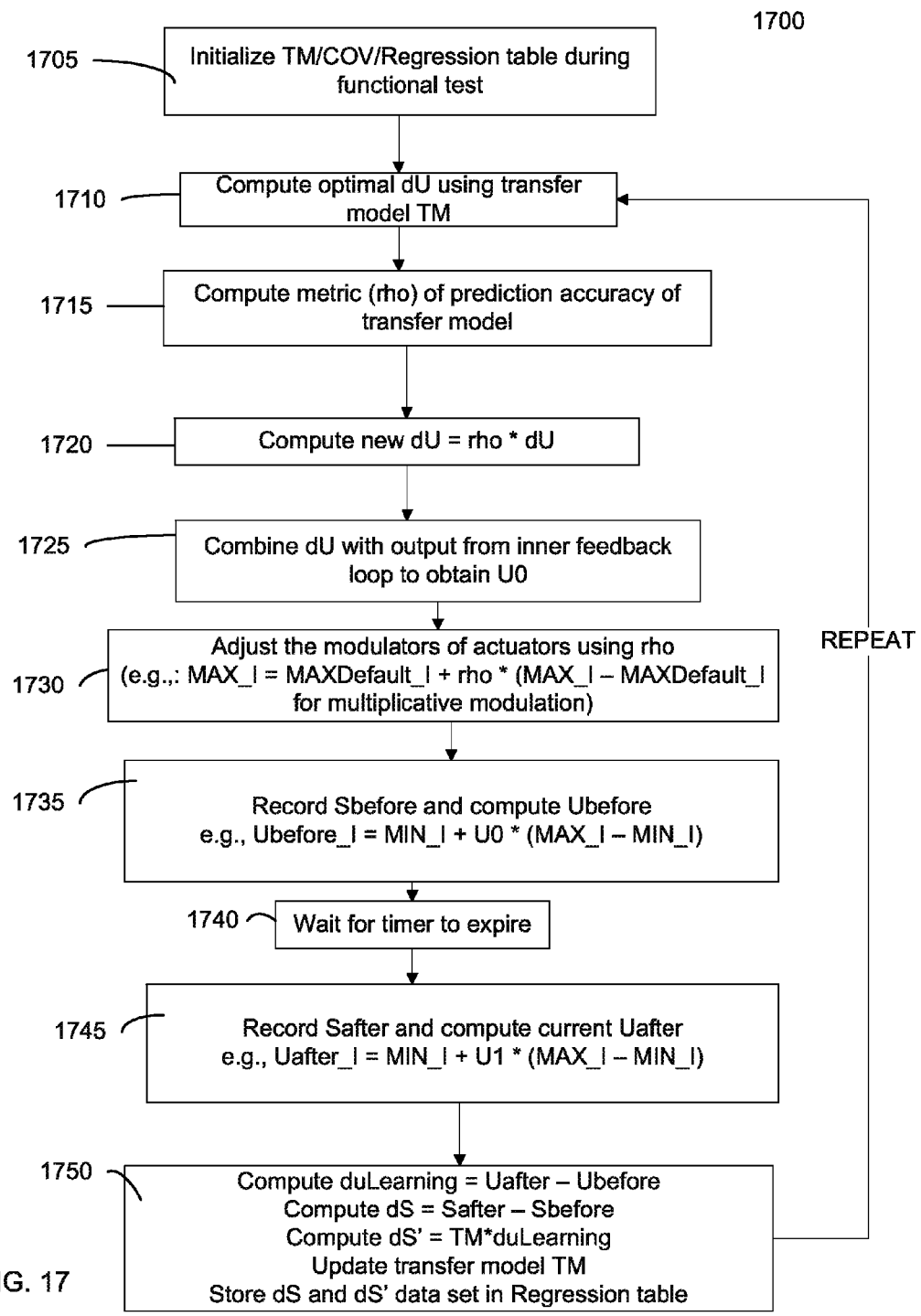
FIG. 17 shows a flowchart illustrating a method 1700 for using predictive control to determine midpoints and extremum levels of operation according to embodiments of the present invention.

FIG. 17 shows a flowchart illustrating a method 1700 for using predictive control to determine midpoints and extremum levels of operation according to embodiments of the present invention. Method 1700 provides a combination of optimization methods and prediction accuracy methods, all within a framework of extrema/midpoints.

In step 1705, the transfer model TM, covariance function (e.g. a covariance matrix) for updating TM, and a regression table can be initialized, e.g., during a functional test. This step may be performed as in step 1505. In step 1710, an optimal dU is calculated using a transfer model TM, e.g., using optimization of a penalty function. In step 1715, a metric of prediction accuracy of the transfer model (such as a correlation coefficient) is determined, e.g., as described in herein. Other metrics that assess prediction accuracy, such as the probability that the measured values and the predicted values have the same mean and/or the same variance, could be used in 1715 instead of the correlation coefficient. In step 1720, dU may be modified by rho. This step is an example of a step that is optional.

In step 1725, dU may optionally be combined with an output of a feedback inner loop, e.g., an output of PID 1615 or 1625, (e.g. by scaling a PID output using a modulator so that the result is the PID output plus dU). The feedback loop is referred to as "inner" in that this loop repeats more often, i.e., it repeats a plurality of times between iterations of the loop shown in FIG. 17. Note that in method 1500 there was no inner loop. In other embodiments, dU can be used to adjust a lower/upper limit (adjustment may be up or down of either limit) of the actuator, e.g., such that the operation level cannot exceed either limit. Note that changing the lower/upper limit (also called extremum, i.e. maximum and minimum) can also affect the overall value for the midpoint of the operation levels of the actuators. Likewise, changing the midpoint level can also affect the overall values for the extremum operation levels of the actuators. The value for dU can also be used to determine an appropriate midpoint for a set of actuators, which can then be used to adjust the proposed operation level for each actuator.

In step 1730, the maximum and minimum of the actuator modulators can be adjusted using rho. The maximum and minimum values for the modulators can define a range of operation of a particular actuator, and thus be used to scale a proposed value for an operation level. Each actuator modulator can have upper and lower limits for operation. In one embodiment, these limits can be specified at modulators 1627. The upper limits can be lowered to save energy when the transfer model is accurate, and/or raised when the transfer model is inaccurate. In one implementation, the following formula can be used: MAXNew=MAXDefault+rho*(MAX−MAXDefault). Using such a formulation, an upper limit will never get bigger if the MAXDefault is >=MAX. If the MAXDefault<=MAX, the new extremum will never get smaller. Either construction may be used for a lower or upper limit of a modulator. However, other formulations may allow for movement up or down in a modulator, depending on if the transfer model is accurate or inaccurate. Adjustment to the modulators used for midpoint control for a set of actuators can occur in a similar manner. These adjustments to the modulators can apply to modulators connected to both the extremum PID object and the midpoint PID object.

In step 1735, current values for the sensors are recorded as $S_{before}$. Also, the new value of U is computed from the proposed operation level U0, e.g., from an output of an optimization method (i.e. an optimal dU) or an output of a PID, which may receive an optimal dU. In one embodiment, the new U (called $U_{before}$) is computed using the MAX for an modulator that is controlled through an extremum inner PID loop. In one implementation, Ubefore=MN+PIDOutput*(MAX−MIN). This Ubefore can then be used as the setting for the respective actuator. The other actuators being controlled by the extremum PID object can also be controlled with similar calculated Ubefore values. Thus, the formula can involve vector values and generically be viewed as a single equation for a whole set of actuators.

In step 1740, the actuators are run until a condition is reached, e.g., a quasi-steady state condition as measured by a timer expiring. In one embodiment, during this time the values of U can still be updated. For example, midpoints or extrema of the sensor values can be compared to reference values, or the sensor values themselves can be compared to reference values, and the difference can be used to determine whether to provide an increase or decrease to the actuators. In one embodiment, this update can use the transfer model, e.g., using an inverse of the transfer model as described in Federspiel I. Note that the new MAX remains the same during this period of when just the inner loop is updating. Such a two-level process allows for control of the system at a finer level and adapt to changes in load with a better response than if the system were to stay constant until the timer expires, or other stopping condition.

In step 1745, after the condition is reached, a current value of the sensors is determined as $S_{after}$. The current value of U (called $U_{after}$) can be computed from a most recent proposed operation level U1 output from an inner control loop, e.g., from PID 1615 or 1625. The value of U for the Ith actuator can be computed using the Ith value of the vector of MAX values which have not changed. In one implementation, Uafter_i=MAX_i+U1_i*(MAX_i).

In step 1750, various values related to updating the transfer model and determining the accuracy of the transfer model are determined. For example, the change in operation levels before and after a timer can be computed: duLearning=$U_{after}$−$U_{before}$. The sensors values before and after a time can be computed: dS=$S_{after}$−$S_{before}$. A value for what the transfer model would have predicted for the change in sensor value can be computed from duLearning: dS'=TM*duLearning. The dS and dS' data sets can be stored, e.g., in a regression table. The transfer model TM can be also be updated, e.g., as is described herein using dS and duLearning. Exceptions can be made for when dUlearning=0, so that the transfer model is not updated, and the current datapoint (dS,dS') is not used to determine correlation, e.g., by not being stored in a regression table.

The method can then repeat to step 1710, where $U_{after}$ can be used as the starting point to determine an optimal dU. In one embodiment, the previous MAX_I/MIN_I and PID output can be used to determine parameters for contributions to the penalty function for a large change in U or an exceedance of an upper or lower limit.

Any of the environmental maintenance systems could be applied to a number of other types of systems besides HVAC systems. For example, the control system could be applied to lighting control systems, where the actuators could be dimmable ballasts and the sensors could be photocells distributed throughout the lighted area. Thus, one of the environments being controlled can be the light of an area. A heuristic control can use a PID feedback loop to regulate either the midpoint (e.g., average) light level or the extremum (e.g., minimum) light level by sending a common control action from the PID object to all of the dimmable ballasts. A penalty function that includes lighting power levels and potentially penalties for exceedances and deviations from a midpoint setting would be used in combination with model-based predictions to modulate the PID feedback command to each ballast. These optimal, predictive modulations of the PID commands can be attenuated if recent past prediction accuracy was not high, with more attenuation as the prediction accuracy becomes worse.

XII. Computer System

Figure 18:
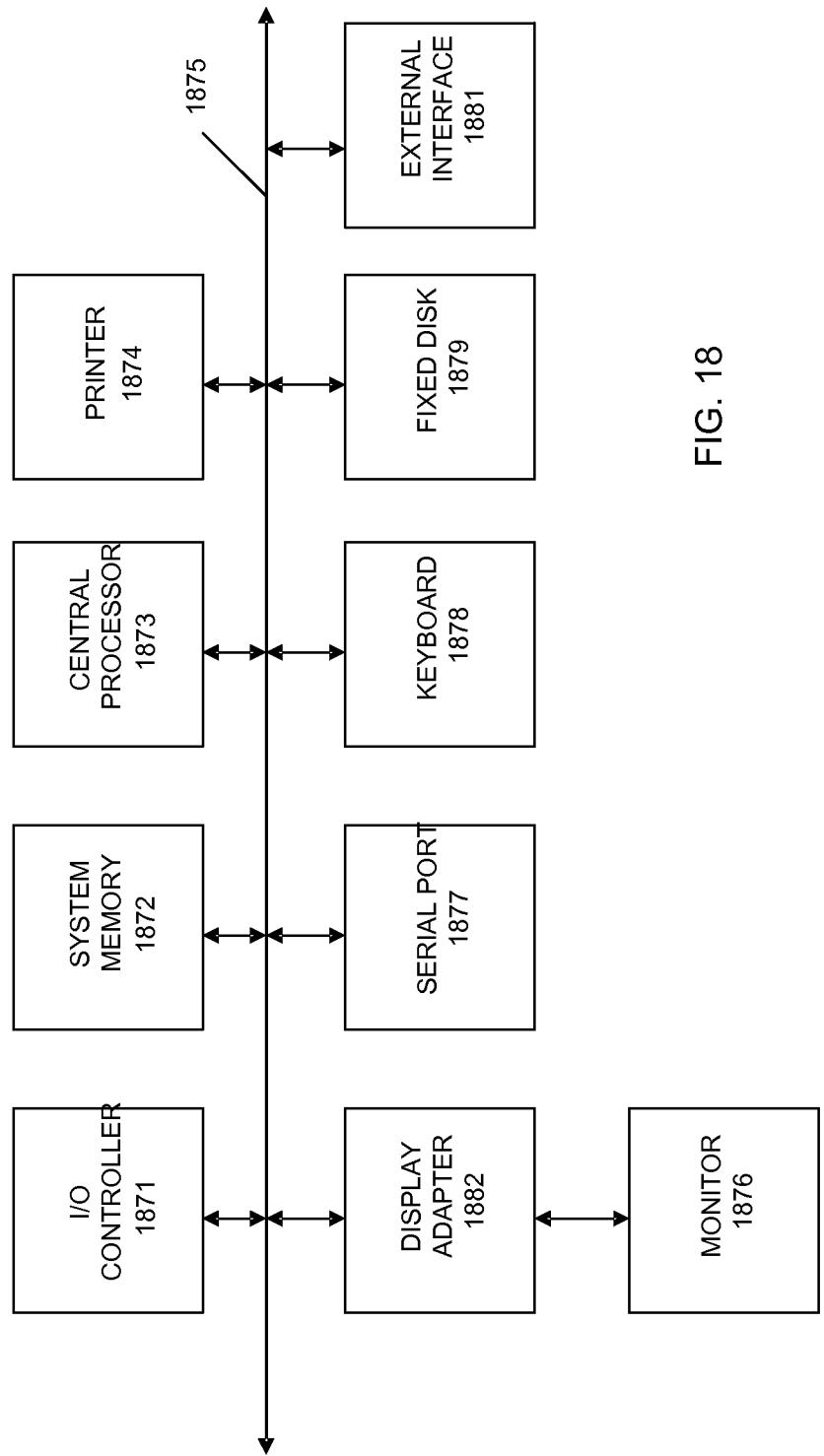
FIG. 18 shows a block diagram of an exemplary computer apparatus usable with system and methods according to embodiments of the present invention.

Any of the computer systems mentioned herein may utilize any suitable number of subsystems. Examples of such subsystems are shown in FIG. 18 in computer apparatus 1800. In some embodiments, a computer system includes a single computer apparatus, where the subsystems can be the components of the computer apparatus. In other embodiments, a computer system can include multiple computer apparatuses, each being a subsystem, with internal components.

The subsystems shown in FIG. 18 are interconnected via a system bus 1875. Additional subsystems such as a printer 1874, keyboard 1878, fixed disk 1879, monitor 1876, which is coupled to display adapter 1882, and others are shown. Peripherals and input/output (I/O) devices, which couple to I/O controller 1871, can be connected to the computer system by any number of means known in the art, such as serial port 1877. For example, serial port 1877 or external interface 1881 (e.g. Ethernet, Wi-Fi, etc.) can be used to connect computer system 1800 to a wide area network such as the Internet, a mouse input device, or a scanner. The interconnection via system bus 1875 allows the central processor 1873 to communicate with each subsystem and to control the execution of instructions from system memory 1872 or the fixed disk 1879, as well as the exchange of information between subsystems. The system memory 1872 and/or the fixed disk 1879 may embody a computer readable medium. Any of the values mentioned herein can be output from one component to another component and can be output to the user.

A computer system can include a plurality of the same components or subsystems, e.g., connected together by external interface 1881 or by an internal interface. In some embodiments, computer systems, subsystem, or apparatuses can communicate over a network. In such instances, one computer can be considered a client and another computer a server, where each can be part of a same computer system. A client and a server can each include multiple systems, subsystems, or components.

It should be understood that any of the embodiments of the present invention can be implemented in the form of control logic using hardware (e.g. an application specific integrated circuit or field programmable gate array) and/or using computer software with a generally programmable processor in a modular or integrated manner. Based on the disclosure and teachings provided herein, a person of ordinary skill in the art will know and appreciate other ways and/or methods to implement embodiments of the present invention using hardware and a combination of hardware and software.

Any of the software components or functions described in this application may be implemented as software code to be executed by a processor using any suitable computer language such as, for example, Java, C++ or Perl using, for example, conventional or object-oriented techniques. The software code may be stored as a series of instructions or commands on a computer readable medium for storage and/or transmission, suitable media include random access memory (RAM), a read only memory (ROM), a magnetic medium such as a hard-drive or a floppy disk, or an optical medium such as a compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium according to an embodiment of the present invention may be created using a data signal encoded with such programs. Computer readable media encoded with the program code may be packaged with a compatible device or provided separately from other devices (e.g., via Internet download). Any such computer readable medium may reside on or within a single computer program product (e.g. a hard drive, a CD, or an entire computer system), and may be present on or within different computer program products within a system or network. A computer system may include a monitor, printer, or other suitable display for providing any of the results mentioned herein to a user.

Any of the methods described herein may be totally or partially performed with a computer system including a processor, which can be configured to perform the steps. Thus, embodiments can be directed to computer systems configured to perform the steps of any of the methods described herein, potentially with different components performing a respective steps or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, circuits, or other means for performing these steps.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

A recitation of "a", "an" or "the" is intended to mean "one or more" unless specifically indicated to the contrary.

All patents, patent applications, publications, and descriptions mentioned above are herein incorporated by reference in their entirety for all purposes. None is admitted to be prior art.

What is claimed is:

1. A method of controlling an environmental maintenance system that includes a plurality of actuators and a plurality of sensors, each sensor measuring a value of a physical condition of an environment, the method comprising:
receiving sensor values S corresponding to the sensors;
determining a potential change dU to operation levels U of the actuators;
calculating, with a computer system, a first contribution to a penalty function by:
applying a transfer model to dU to determine a predicted change dS in the sensor values S, the transfer model providing a relation between changing an operation level of an actuator and resulting changes in sensor values;
determining new sensor values $S_{New}$ from the predicted change dS; and
using $S_{New}$ to determine the first contribution to the penalty function, the first contribution being based on a relationship of each new sensor value relative to one or more respective setpoint values;
calculating, with the computer system, a second contribution to the penalty function by:
determining new operation levels $U_{new}$, corresponding to the potential change dU to the operation levels U;
for each new operation level, determining a cost of operating the corresponding actuator with the new operation level; and
aggregating the costs to obtain the second contribution;
determining a first value of the penalty function based on the first and second contributions for the potential change dU;
determining an optimal change to the operation levels U of the actuators based on values of the penalty functions for a plurality of potential changes to the operation levels U; and
setting the operation levels of the actuators based on the optimal change.

2. The method of claim 1, wherein setting the operation levels of the actuators based on the optimal change includes:
adjusting the optimal change; and
adding the adjusted optimal change to U.

3. The method of claim 2, wherein adjusting the optimal change includes at least one of normalization, randomization, and scaling.

4. The method of claim 2, further comprising:
determining an accuracy of the transfer model by comparing predicted sensor value with measured sensor values, wherein the optimal change is adjusted based on an accuracy of the transfer model.

5. The method of claim 1, wherein setting the operation levels of the actuators based on the optimal change includes:
receiving new settings for the actuators; and
adjusting the new settings based on the optimal change.

6. The method of claim 5, further comprising:
calculating the new settings using a PID object, wherein the PID object provides new settings based on:
a comparison of a midpoint of the sensor values to a midpoint reference, or
a comparison of an extremum of the sensor values to an extremum reference.

7. The method of claim 1, wherein a maximum number of potential changes to the operation levels U are analyzed to determine the optimal change, and wherein the optimal change is selected from the plurality of potential changes if at least one of the corresponding potential changes has a value for the penalty function that is less than the penalty function with no change to U.

8. The method of claim 1, wherein the cost of operating an actuator with a new operation level includes at least one of an energy cost and a maintenance cost.

9. The method of claim 8, wherein the cost of operating the actuator includes:
receiving a cost per rate of energy usage; and
inputting the cost per rate of energy usage and the new operation level into a function that outputs the cost of operating the corresponding actuator.

10. The method of claim 1, wherein using $S_{New}$ to determine the first contribution includes:
for each sensor:
inputting $S_{New}$ into a respective function that has at least one setpoint of the sensor as a parameter to obtain an output of a partial first contribution; and
summing the partial first contributions from the sensors.

11. The method of claim 10, wherein a respective function includes:
taking a difference between the corresponding new sensor value $S_{New}$ and a setpoint; and
multiplying the difference by a gain factor to obtain the partial contribution for the sensor.

12. The method of claim 1, wherein determining a potential change dU to operation levels U of the actuators is accomplished by receiving the new operation levels $U_{new}$, where $U_{new}$=U+dU, and wherein applying a transfer model to dU to determine a predicted change dS in the sensor values S is accomplished by applying the transfer model to the potential new value for U.

13. The method of claim 1, wherein determining a potential change dU to operation levels U of the actuators uses an optimization algorithm that incorporates past potential changes to determine the current potential change.

14. The method of claim 1, wherein the setpoint values include a range of sensor values.

15. The method of claim 1, wherein the transfer model is a matrix of numerical values.

16. A computer product comprising a non-transitory computer readable medium storing a plurality of instructions that when executed control a computer system to control an environmental maintenance system that includes a plurality of actuators and a plurality of sensors, each sensor measuring a value of a physical condition of an environment, the instructions comprising:
receiving sensor values S corresponding to the sensors;
determining a potential change dU to operation levels U of the actuators;
calculating a first contribution to a penalty function by:
applying a transfer model to dU to determine a predicted change dS in the sensor values S, the transfer model providing a relation between changing an operation level of an actuator and resulting changes in sensor values;

determining new sensor values $S_{New}$ from the predicted change dS; and using $S_{New}$ to determine the first contribution to the penalty function, the first contribution being based on a relationship of each new sensor value relative to one or more respective setpoint values;

calculating a second contribution to the penalty function by:

determining new operation levels $U_{new}$ corresponding to the potential change dU to the operation levels U;

for each new operation level, determining a cost of operating the corresponding actuator with the new operation level; and aggregating the costs to obtain the second contribution;

determining a first value of the penalty function based on the first and second contributions for the potential change dU;

determining an optimal change to the operation levels U of the actuators based on values of the penalty functions for a plurality of potential changes to the operation levels U; and setting the operation levels of the actuators based on the optimal change.

17. The computer product of claim 16, wherein setting the operation levels of the actuators based on the optimal change includes:

adjusting the optimal change; and
adding the adjusted optimal change to U.

18. The computer product of claim 17, wherein the instructions further comprise:

determining an accuracy of the transfer model by comparing predicted sensor value with measured sensor values, wherein the optimal change is adjusted based on an accuracy of the transfer model.

19. The computer product of claim 16, wherein setting the operation levels of the actuators based on the optimal change includes:

receiving new settings for the actuators;
adjusting the new settings based on the optimal change; and
calculating the new settings using a PID object, wherein the PID object provides new settings based on:
a comparison of a midpoint of the sensor values to a midpoint reference, or
a comparison of an extremum of the sensor values to an extremum reference.

20. The computer product of claim 16, wherein a maximum number of potential changes to the operation levels U are analyzed to determine the optimal change, and wherein the optimal change is selected from the plurality of potential changes if at least one of the corresponding potential changes has a value for the penalty function that is less than the penalty function with no change to U.

21. The computer product of claim 16, wherein using $S_{New}$ to determine the first contribution includes:

for each sensor:
inputting $S_{New}$ into a respective function that has at least one setpoint of the sensor as a parameter to obtain an output of a partial first contribution; and
summing the partial first contributions from the sensors.

22. The computer product of claim 16, wherein determining a potential change dU to operation levels U of the actuators is accomplished by receiving the new operation levels $U_{new}$, where $U_{new}=U+dU$, and wherein applying a transfer model to dU to determine a predicted change dS in the sensor values S is accomplished by applying the transfer model to the potential new value for U.

23. An environmental maintenance system comprising:
a plurality of actuators;
a plurality of sensors, each sensor measuring a value of a physical condition of an environment; and
one or more processors configured to:
receive sensor values S corresponding to the sensors;
determine a potential change dU to operation levels U of the actuators;
calculate a first contribution to a penalty function by:
applying a transfer model to dU to determine a predicted change dS in the sensor values S, the transfer model providing a relation between changing an operation level of an actuator and resulting changes in sensor values;
determining new sensor values $S_{New}$ from the predicted change dS;
using $S_{New}$ to determine the first contribution to the penalty function, the first contribution being based on a relationship of each new sensor value relative to one or more respective setpoint values;
calculate a second contribution to the penalty function by:
determining new operation levels $U_{new}$, corresponding to the potential change dU to the operation levels U;
for each new operation level, determining a cost of operating the corresponding actuator with the new operation level;
aggregating the costs to obtain the second contribution;
determine a first value of the penalty function based on the first and second contributions for the potential change dU;
determine an optimal change to the operation levels U of the actuators based on values of the penalty functions for a plurality of potential changes to the operation levels U; and
set the operation levels of the actuators based on the optimal change.

24. The system of claim 23, wherein setting the operation levels of the actuators based on the optimal change includes:
adjusting the optimal change; and
adding the adjusted optimal change to U.

25. The system of claim 24, wherein the one or more processors are further configured to:
determine an accuracy of the transfer model by comparing predicted sensor value with measured sensor values, wherein the optimal change is adjusted based on an accuracy of the transfer model.

26. The system of claim 23, wherein setting the operation levels of the actuators based on the optimal change includes:
receiving new settings for the actuators;
adjusting the new settings based on the optimal change; and
calculating the new settings using a PID object, wherein the PID object provides new settings based on:
a comparison of a midpoint of the sensor values to a midpoint reference, or
a comparison of an extremum of the sensor values to an extremum reference.

27. The system of claim 23, wherein a maximum number of potential changes to the operation levels U are analyzed to determine the optimal change, and wherein the optimal change is selected from the plurality of potential changes if at least one of the corresponding potential changes has a value for the penalty function that is less than the penalty function with no change to U.

28. The system of claim 23, wherein using $S_{New}$ to determine the first contribution includes:
- for each sensor:
    - inputting $S_{New}$ into a respective function that has at least one setpoint of the sensor as a parameter to obtain an output of a partial first contribution; and
- summing the partial first contributions from the sensors.

29. The system of claim 23, wherein determining a potential change dU to operation levels U of the actuators is accomplished by receiving the new operation levels $U_{new}$, where $U_{new}$=U+dU, and wherein applying a transfer model to dU to determine a predicted change dS in the sensor values S is accomplished by applying the transfer model to the potential new value for U.

* * * * *